US012581846B2

(12) United States Patent
Guo et al.

(10) Patent No.: US 12,581,846 B2
(45) Date of Patent: Mar. 17, 2026

(54) ELECTROLUMINESCENT POLYMER BASED ON PHENANTHROIMIDAZOLE UNITS, PREPARATION METHOD THEREFOR, AND USE THEREOF

(71) Applicant: SOUTH CHINA UNIVERSITY OF TECHNOLOGY, Guangdong (CN)

(72) Inventors: Ting Guo, Guangzhou (CN); Lei Ying, Guangzhou (CN)

(73) Assignee: SOUTH CHINA UNIVERSITY OF TECHNOLOGY, Guangzhou (CN)

(*) Notice: Subject to any disclaimer, the term of this patent is extended or adjusted under 35 U.S.C. 154(b) by 718 days.

(21) Appl. No.: 17/995,878

(22) PCT Filed: Oct. 15, 2020

(86) PCT No.: PCT/CN2020/121162
§ 371 (c)(1),
(2) Date: Oct. 10, 2022

(87) PCT Pub. No.: WO2021/203663
PCT Pub. Date: Oct. 14, 2021

(65) Prior Publication Data

US 2023/0240127 A1 Jul. 27, 2023

(30) Foreign Application Priority Data

Apr. 10, 2020 (CN) ......................... 202010279534.8

(51) Int. Cl.
*H10K 85/10* (2023.01)
*C08G 61/12* (2006.01)
(Continued)

(52) U.S. Cl.
CPC .......... *H10K 85/111* (2023.02); *C08G 61/122* (2013.01); *C09D 5/22* (2013.01);
(Continued)

(58) Field of Classification Search
CPC .. H10K 85/111; H10K 85/151; H10K 71/135; H10K 71/13; H10K 50/11;
(Continued)

(56) References Cited

U.S. PATENT DOCUMENTS

| | | | | |
|---|---|---|---|---|
| 9,893,300 | B1 | 2/2018 | Cheng | |
| 2007/0235723 | A1* | 10/2007 | Li | H10K 85/111 257/40 |
| 2014/0151661 | A1 | 6/2014 | Miyata | |

FOREIGN PATENT DOCUMENTS

| | | |
|---|---|---|
| CN | 104650041 | 5/2015 |
| CN | 107759777 | 3/2018 |

(Continued)

OTHER PUBLICATIONS

Ying Zhang et al, "High Efficiency Nondoped Deep-Blue Organic Light Emitting Devices Based on Imidazole-π-triphenylamine Derivatives", Chemistry of Materials 2012, vol. 24, pp. 61-70, Published: Nov. 29, 2011.

*Primary Examiner* — Shane Fang
(74) *Attorney, Agent, or Firm* — JMB Davis Ben-David

(57) ABSTRACT

This application relates to an electroluminescent polymer based on phenanthroimidazole units and its preparation and use. The electroluminescent polymer based on phenanthroimidazole units has a structure as shown in the formula (I), and the side chain thereof contains phenanthroimidazole units. The electroluminescent polymer (1) has the properties of hybridized local and charge-transfer states; (2) the phenanthroimidazole unit has a large degree of conjugation and a strong rigidity; and (3) the raw materials of the polymer are cheap, the synthetic route is simple, and purification is convenient. The polymer has a good solubility, and can be used to prepare large-area flexible display devices by means of a solution processing technology. The
(Continued)

polymer has great development potential and prospects in the field of organic electronic display.

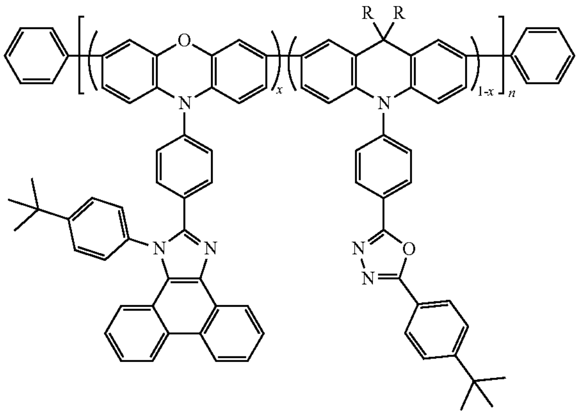

7 Claims, 3 Drawing Sheets

(51) Int. Cl.

| | |
|---|---|
| ***C09D 5/22*** | (2006.01) |
| ***C09D 11/102*** | (2014.01) |
| ***C09D 11/322*** | (2014.01) |
| ***C09D 11/50*** | (2014.01) |
| ***C09D 165/00*** | (2006.01) |
| ***C09K 11/02*** | (2006.01) |
| ***C09K 11/06*** | (2006.01) |
| ***H10K 50/11*** | (2023.01) |
| ***H10K 71/13*** | (2023.01) |

(52) U.S. Cl.

CPC .......... *C09D 11/102* (2013.01); *C09D 11/322* (2013.01); *C09D 11/50* (2013.01); *C09D 165/00* (2013.01); *C09K 11/025* (2013.01); *C09K 11/06* (2013.01); *H10K 85/151* (2023.02); *C08G 2261/124* (2013.01); *C08G 2261/1412* (2013.01); *C08G 2261/148* (2013.01); *C08G 2261/149* (2013.01); *C08G 2261/1646* (2013.01); *C08G 2261/3241* (2013.01); *C08G 2261/3245* (2013.01); *C08G 2261/411* (2013.01); *C08G 2261/5222* (2013.01); *C08G 2261/95* (2013.01); *C09K 2211/1475* (2013.01); *H10K 50/11* (2023.02); *H10K 71/13* (2023.02); *H10K 71/135* (2023.02)

(58) Field of Classification Search

CPC ............ C08G 61/122; C08G 2261/124; C08G 2261/1412; C08G 2261/148; C08G 2261/149; C08G 2261/1646; C08G 2261/3241; C08G 2261/3245; C08G 2261/411; C08G 2261/5222; C08G 2261/95; C09D 5/22; C09D 11/102; C09D 11/32; C09D 11/50; C09D 11/25; C09D 11/06; C09D 165/00; C09K 2211/1475

See application file for complete search history.

(56) References Cited

FOREIGN PATENT DOCUMENTS

| | | |
|---|---|---|
| CN | 107805249 | 3/2018 |
| CN | 108559063 | 9/2018 |
| CN | 108822040 | 11/2018 |
| CN | 108912309 | 11/2018 |
| CN | 109096426 | 12/2018 |
| CN | 109705041 | 5/2019 |
| CN | 109824870 | 5/2019 |
| CN | 111454435 | 7/2020 |
| WO | 2009092671 | 7/2009 |
| WO | 2012131084 | 10/2012 |

* cited by examiner

ELECTROLUMINESCENT POLYMER BASED ON PHENANTHROIMIDAZOLE UNITS, PREPARATION METHOD THEREFOR, AND USE THEREOF

CROSS-REFERENCE TO RELATED APPLICATIONS

This is the U.S. National Stage of International Patent Application No. PCT/CN2020/121162 filed on Oct. 15, 2020, which in turn claims the benefit of Chinese Patent Application No. 202010279534.8 filed on Apr. 10, 2020.

TECHNICAL FIELD

The present invention belongs to an organic photoelectric technical field, specifically relates to an electroluminescent polymer based on a phenanthroimidazole unit, a preparation method therefor, and a use thereof.

BACKGROUND

Organic Light-Emitting Diodes (OLED) have unique advantages such as fast response, wide viewing angle, rich color, thin thickness, self-luminescence, and being bendable, rollable and even foldable, and are known as the most potential third-generation display technology, which have great application prospects in electronic products such as smart phones, TVs, tablet computers, VR (virtual reality, head-mounted display equipments) and wearable smart equipments.

In OLED devices, the luminescent material determines the fabrication method and performance of the device. During the operation of the device, electrons and holes recombine to generate excitons. The internal quantum efficiency of the fluorescent material device using only 25% of singlet excitons is theoretically lower than 25%. If the other 75% of triplet excitons can be utilized, the light-emitting efficiency of the fluorescent material can be greatly improved. The utilization of reverse inter-system crossing of triplet excitons is an effective approach. At present, Professor Yuguang Ma proposed the theory of hybridized local and charge-transfer states to guide the design of fluorescent materials with high utilization for excitons. Wherein, the phenanthroimidazole unit has been proved to be a classic structure for constructing electroluminescent materials. It has a large conjugated rigid structure, which can not only improve the thermal stability of the material, but also increase the radiation transition rate of the material and improve its luminescence efficiency. At the same time, the two N atoms on the imidazole ring show two states of electron-rich state and electron-deficient state respectively, giving it a bipolar characteristic, and the luminescent material has a relatively balanced electron/hole injection/transport performance, which fundamentally improves recombination probability for excitons. At present, there are many researches on luminescent materials based on the phenanthroimidazole unit, but most of them focus on the research on small molecular compounds. The research on electroluminescent polymers with hybridized local and charge-transfer state performance is still in primary stage. The type and the quantity of the materials are extremely rare, and the properties still need to be improved.

Electroluminescent polymers based on the phenanthroimidazole unit are designed to prepare large-area flexible devices by means of a technology of solution processing. The design concept of hybridized local and charge-transfer states is adopted to synthesize high-performance polymers to meet the market demand.

SUMMARY

In order to address the shortcomings and deficiencies of the prior art described above, a primary objective of the present invention is to provide an electroluminescent polymer based on a phenanthroimidazole unit. The electroluminescent polymer has excellent solubility and thermal stability. It can be used to prepare an electroluminescent device by a preparation technology of solution processing. Meanwhile, it has properties of hybridized local and charge-transfer states. A high-efficient and stable electroluminescent polymer can be obtained, and has great application potential.

Another objective of the present invention is to provide a preparation method for the electroluminescent polymer based on the phenanthroimidazole unit.

Still another objective of the present invention is to provide a use of the electroluminescent polymer based on the phenanthroimidazole unit in preparing a light-emitting layer of an organic electroluminescent device.

Objectives of the present invention are realized by the following technical solutions.

An electroluminescent polymer based on a phenanthroimidazole unit has a chemical structural formula as shown below:

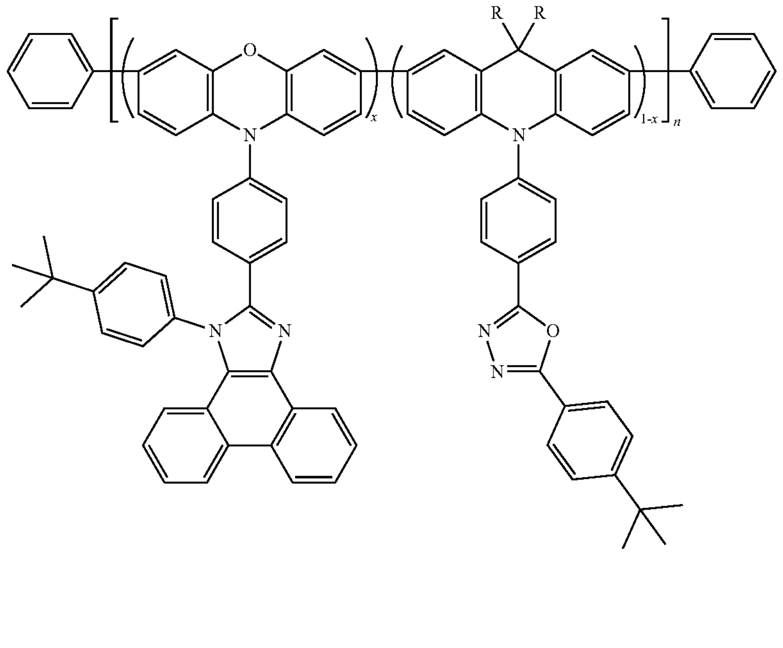

wherein, R is relatively independently one of a linear-chain, branched or cyclic alkyl with 1 to 20 carbon atoms, a linear-chain, branched or cyclic alkenyl with 2 to 20 carbon atoms, and a linear-chain, branched or cyclic alkynyl with 2 to 20 carbon atoms; preferably octyl.

x meet 0.001≤x<0.50; preferably, 0.05≤x≤0.20; and n is 2 to 300.

A preparation method for the above-described electroluminescent polymer based on the phenanthroimidazole unit has a following preparation route:

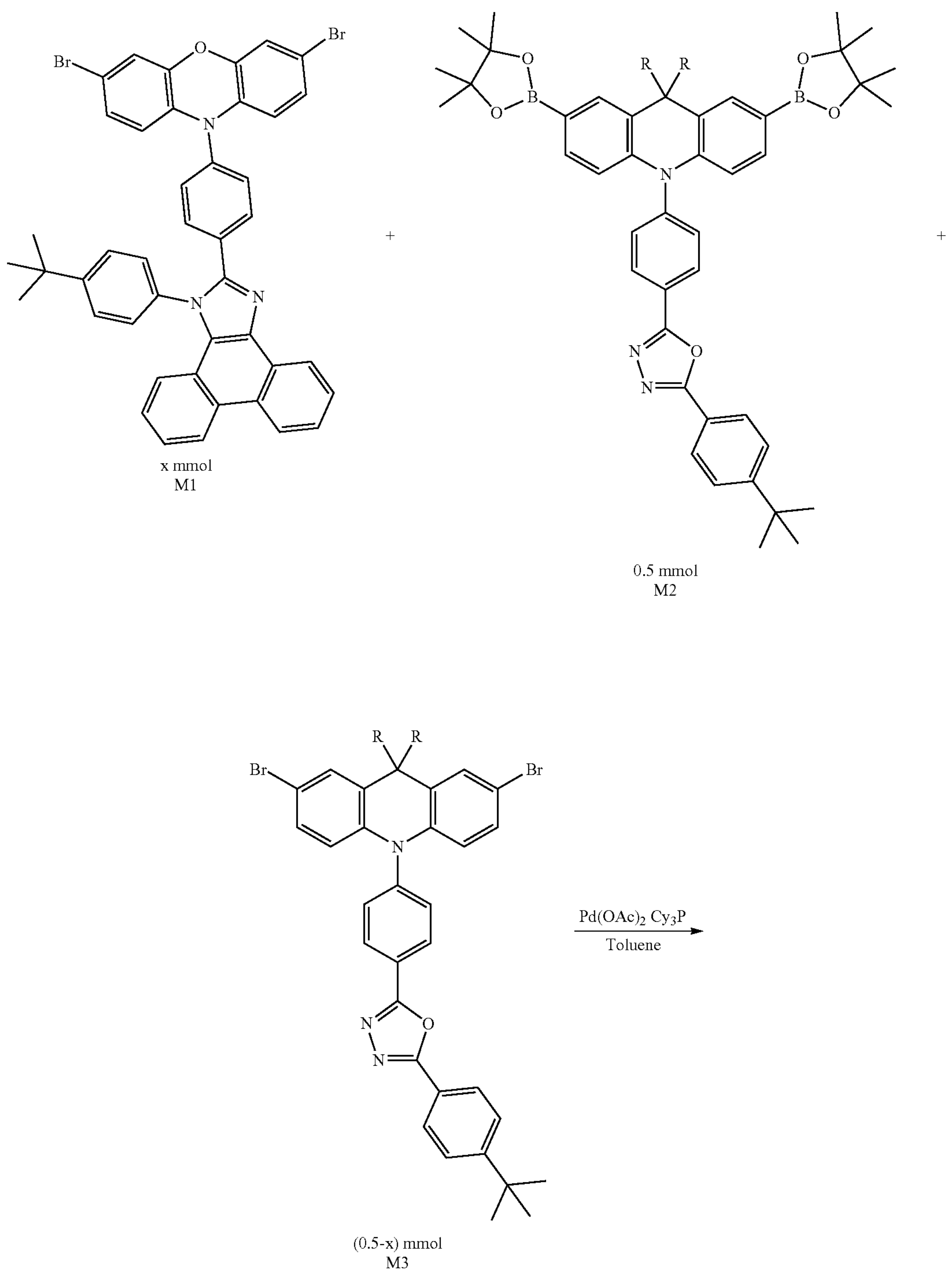

-continued

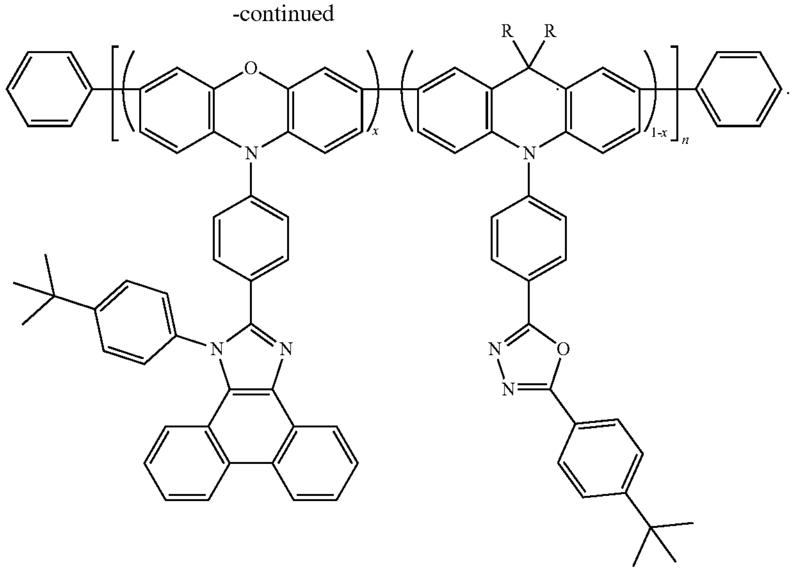

Under a protection of inert gas, the following steps are carried out: dissolving polymeric monomers M1, M2 and M3 into a solvent, then adding a catalyst and an organic alkali tetraethylammonium hydroxide, heating to a temperature of 80 to 100° C. for incurring Suzuki polymerization reaction with a reaction time of 24 h to 48 h; and adding phenylboronic acid, maintaining the temperature and continuing to react for 12 h to 24 h; and adding bromobenzene, continuing to maintain the temperature and react for 12 h to 24 h, and purifying a resulting reaction solution after stopping the reaction, to obtain a target product.

The solvent is at least one of toluene, tetrahydrofuran, chloroform and chlorobenzene;

A molar ratio of the used polymeric monomers M1 to M2 to M3 is x:0.5:(0.5−x); wherein a range of x is $0.001 \leq x < 0.50$; preferably, $0.05 \leq x \leq 0.20$; a volume ratio of the solvent to the organic alkali tetraethylammonium hydroxide aqueous solution (with a mass fraction of 20%) is 15 to 3:1; and a ratio of a molar amount of the tetraethylammonium hydroxide to the total molar amount of the polymeric monomers is 1 to 5:1.

The catalyst is a system of palladium acetate and tricyclohexyl phosphine, wherein an amount of the catalyst is 5% c to 5% of the total molar amount of the monomers for reaction, and a molar ratio of the palladium acetate to the tricyclohexyl phosphine is 1:2.

An amount of the phenylboronic acid is 5% to 30% of the total molar amount of the monomers for reaction; and an amount of the bromobenzene is 2 to 20 times of a molar amount of the phenylboronic acid. The purifying refers to after cooling the resulting reaction solution down to room temperature, pouring the reaction solution into methanol for precipitating, filtrating and drying to obtain a crude product, and dissolving the crude product in toluene, separating by column chromatography, concentrating, adding into methanol again for precipitating, filtrating and drying, then extracting with methanol, acetone and tetrahydrofuran in sequence to remove small molecules, adding into methanol for precipitating, and drying to obtain a solid to be the purified electroluminescent polymer based on the phenanthroimidazole unit.

The above-described electroluminescent polymer based on the phenanthroimidazole unit is applied in preparing a light-emitting layer of a light-emitting diode.

The above-described electroluminescent polymer based on the phenanthroimidazole unit has good solubility, and can be dissolved in common organic solvents.

The preparing the light-emitting layer of the electroluminescent device includes the following steps: dissolving the electroluminescent polymer based on the phenanthroimidazole unit with an organic solvent, and forming a film through spin coating, inkjet printing or printing. The organic solvent therein includes toluene, chlorobenzene, xylene, tetrahydrofuran or chloroform. The toluene can dissolve 15 to 50 mg/mL of the electroluminescent polymer at room temperature.

Relative to the prior art, the electroluminescent polymer based on the phenanthroimidazole unit of the present invention has the following advantages and beneficial effects.

(1) The electroluminescent polymer based on the phenanthroimidazole unit of the present invention has cheap monomer materials and simple synthetic route, is easy for purification, is convenient for research for a relationship between the structure and properties, and is beneficial for industrial scaled-up production.

(2) The electroluminescent polymer based on the phenanthroimidazole unit of the present invention has excellent thermal stability and solubility, can be used to prepare the electroluminescent device by the technology of solution processing, is beneficial for preparing large-area flexible display devices, and is expected to realize commercial application.

(3) The electroluminescent polymer based on the phenanthroimidazole unit of the present invention has luminescence properties of hybridized local and charge-transfer states, and singlet excitons with high utilization, and is beneficial for improving electroluminescence properties.

DETAILED DESCRIPTION OF EMBODIMENTS

Figure 1:
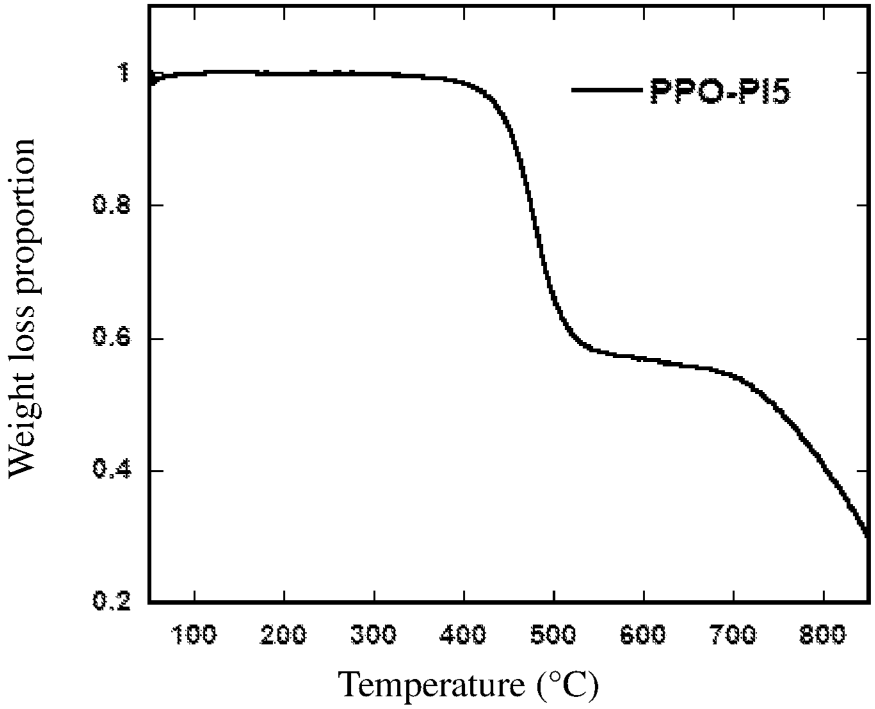
FIG. 1 shows a thermogravimetric curve of a polymer PPO-PI5.

The present invention will be further described below in detail in combination with Examples and the drawings, but embodiments of the present invention are not limited thereto. In Examples of the present invention, where particular conditions are not noted, it is carried out in accordance with conventional conditions or conditions recommended by the manufacturer. The reagents and instruments without manufacturers thereof specified are all conventional products that can be commercially purchased from the market.

Example 1

(1) The Preparation of 2-(4-bromophenyl)-1-(4-tert-butylphenyl)-1H-phenanthro [9,10-d]imidazole The following steps are performed: under argon atmosphere, dissolving 9,10-phenanthrenequinone (10.8 g, 20 mmol), 4-tert-butylaniline (14.9 g, 100 mmol), p-bromobenzaldehyde (3.68 g, 20 mmol) and ammonium acetate (6.16 g, 80 mmol) into 150 mL acetic acid, reacting at 120° C. for 12 h, quenching the reaction with water after stopping the reaction, concentrating the solvent, extracting with dichloromethane and drying with anhydrous magnesium sulfate, and purifying by silica gel column chromatography. A mixed solvent of petroleum ether and dichloromethane (with a volume ratio of 4:1) is used as an eluent to obtain a white solid, which has a yield of 82%. The results for $^1$HNMR, $^{13}$CNMR, MS and element analysis show that the obtained compound is the target product. The chemical reaction equation for the preparation process is shown as below: The chemical reaction equation for the preparation process is shown as below:

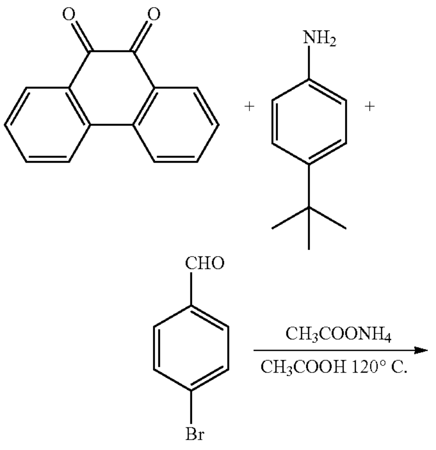

-continued

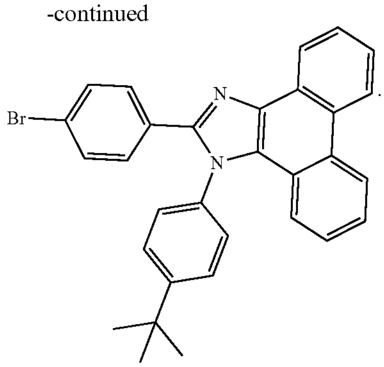

(2) The Preparation of 10-(4-(1-(4-(tert-butyl)phenyl)-1H-phenanthro[9,10-d]imidazole-2-yl]phenyl)-10H-phenoxazine The following steps are performed: in argon atmosphere, dissolving a compound 2-(4-bromophenyl)-1-(4-tert-butylphenyl)-1H-phenanthro[9,10-d]imidazole (5.20 g, 10 mmol) and phenoxazine (2.75 g, 15 mmol) into a toluene in a 250 mL two-necked flask, reacting in the presence of a catalyst palladium acetate ($Pd(OAc)_2$) (0.22 g, 1.0 mmol) and sodium tert-butoxide (5.61 g, 50 mmol) at 90° C. for 8 h, quenching the reaction with water after stopping the reaction, extracting with dichloromethane and drying with anhydrous magnesium sulfate, and purifying by silica gel column chromatography. A mixed solvent of petroleum ether and dichloromethane (with a volume ratio of 1:1) is used as an eluent to obtain a white solid, which has a yield of 92%. The results for $^1$HNMR, $^{13}$CNMR, MS and element analysis show that the obtained compound is the target product. The chemical reaction equation for the preparation process is shown as below:

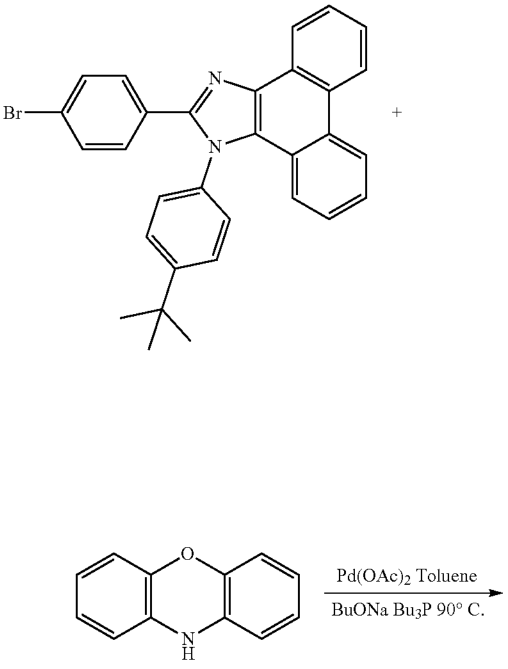

-continued

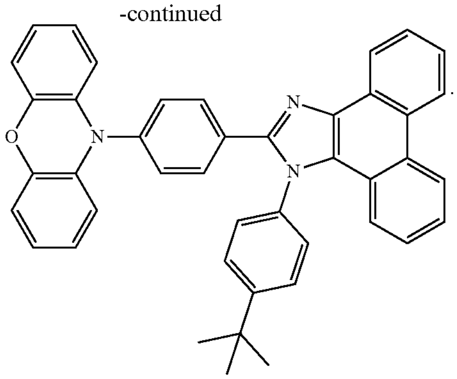

(3) The Preparation of 3,7-dibromo-10-(4-(1-(4-(tert-butyl)phenyl)-1H-phenanthro[9,10-d]imidazole-2-yl]phenyl)-10H-phenoxazine (M1)

The following steps are performed: dissolving 10-(4-(1-(4-(tert-butyl)phenyl)-1H-phenanthro[9,10-d]imidazole-2-yl]phenyl)-10H-phenoxazine (3.04 g, 5.0 mmol) into 10 mL tetrahydrofuran, adding N-bromosuccinimide (NBS, 2.23 g, 12.5 mmol) in dark conditions, reacting at 25° C. for 8 h, quenching the reaction with water after stopping the reaction, extracting with dichloromethane and drying with anhydrous magnesium sulfate, and recrystallizing with methanol/tetrahydrofuran, to obtain a white solid, which has a yield of 83%. The results for $^{1}$HNMR, $^{13}$CNMR, MS and element analysis show that the obtained compound is the target product. The chemical reaction equation for the preparation process is shown as below:

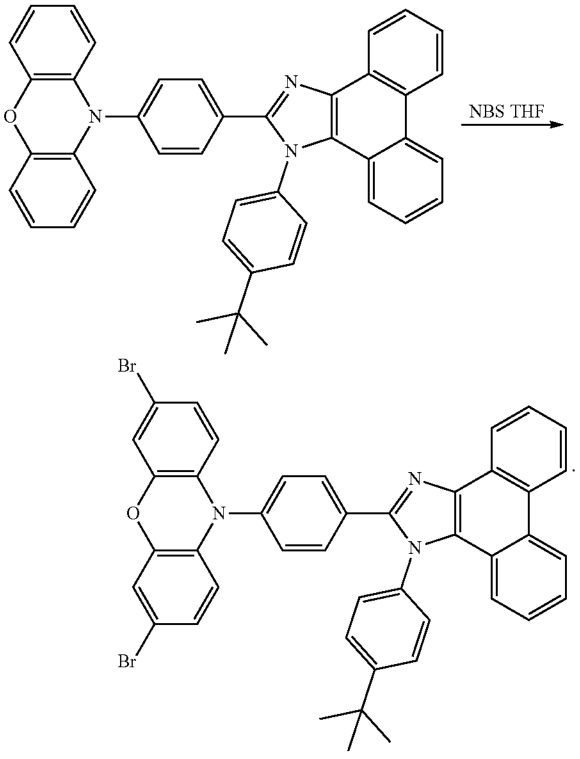

(4) The Preparation of 9,9-dioctyl-9,10-dihydroacridine

The following steps are performed: under the protection of inert gas, dissolving 2-anilinobenzoic acid methyl ester (Cas: 35708-19-1) (3.18 g, 14 mmol) into 80 mL refined anhydrous THF, dropwise adding 1.0 mol·L$^{-1}$ n-octylmagnesium bromide (30.8 mL, 30.8 mmol), raising the temperature to 80° C. and heating reflux, reacting for 16 h, cooling down to room temperature, pouring a reaction mixture into water, extracting with ethyl acetate, collecting an organic layer and concentrating to obtain a crude white product; and dissolving the crude product (4.64 g, 10 mmol) into 80 mL anhydrous dichloromethane, dropwise adding 3.0 mL boron trifluoride diethyl etherate solution into the reaction solution, after stirring at room temperature for 2 h, quenching the reaction with water after stopping the reaction, extracting with dichloromethane and drying with anhydrous magnesium sulfate, concentrating the solution to obtain an earthy yellow solid, and purifying by silica gel column chromatography with a mixed solvent of petroleum ether/dichloromethane (3/1, v/v) used as an eluent, to obtain a white solid, which has a yield of 75%. The results for $^{1}$HNMR, $^{13}$CNMR, MS and element analysis show that the obtained compound is the target product. The chemical reaction equation for the preparation process is shown as below:

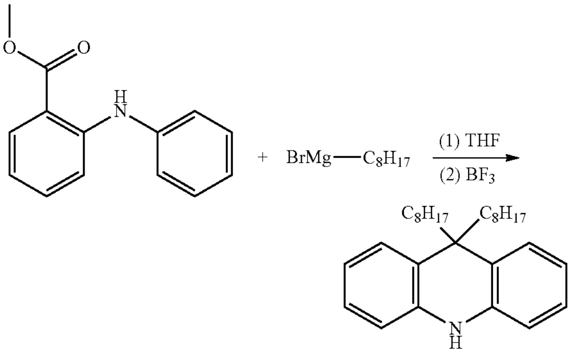

(5) The Preparation of 2-(4-(tert-butyl)phenyl)-5-(4-fluorophenyl)-1,3,4-oxadiazole The following steps are performed: adding 7.68 g 4-tert-butylbenzoyl hydrazine (Cas: 43100-38-5), 4.04 g triethylamine and 200 ml chloroform into a reaction bottle, stirring at 0° C., dropwise adding 20 ml of a chloroform solution containing 6.32 g p-fluorobenzoyl chloride, stopping the reaction after 3 h, removing chloroform through rotary evaporation, washing with petroleum ether for three times, and drying; and adding 6.3 g of a crude product and 15 ml thionyl dichloride into the reaction bottle, reacting at 70° C. for 18 h; after stopping the reaction, pouring the reaction solution into ice water, suction filtrating, and recrystallizing the filtrating residue with ethanol, to obtain 4.5 g white crystal, which has a yield of 76%. The results for $^{1}$HNMR, $^{13}$CNMR, MS and element analysis show that the obtained compound is the target product. The chemical reaction equation for the preparation process is shown as below:

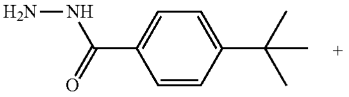

-continued

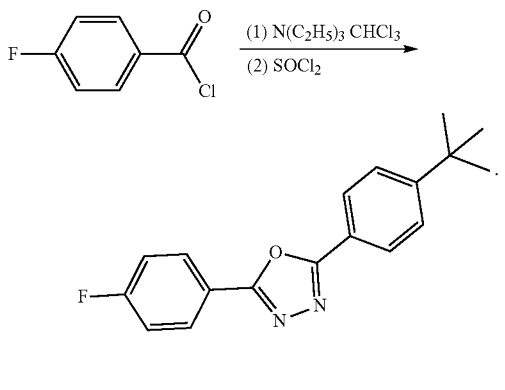

(6) The Preparation of 2-(4-(tert-butyl)phenyl)-5-(4-(9,9-dioctyl-9,10-dihydroacridine-10-yl)phenyl)-1,3,4-oxadiazole The following steps are performed: under argon atmosphere, in 250 mL two-necked flask, dissolving compounds 9,9-dioctyl-9,10-dihydroacridine (4.05 g, 10 mmol) and 2-(4-(tert-butyl)phenyl)-5-(4-fluorophenyl)-1,3,4-oxadiazole (4.44 g, 15 mmol) into toluene, reacting in the presence of a catalyst of palladium acetate ($Pd(OAc)_2$)(0.22 g, 1.0 mmol) and sodium tert-butoxide (5.61 g, 50 mmol) at 90° C. for 8 h, quenching the reaction with water after stopping the reaction, extracting with dichloromethane and drying with anhydrous magnesium sulfate, and purifying by silica gel column chromatography with a mixed solvent of petroleum ether and dichloromethane (with a volume ratio of 1:1) used as an eluent to obtain a white solid, which has a yield of 76%. The results for $^1$HNMR, $^{13}$CNMR, MS and element analysis show that the obtained compound is the target product. The chemical reaction equation for the preparation process is shown as below:

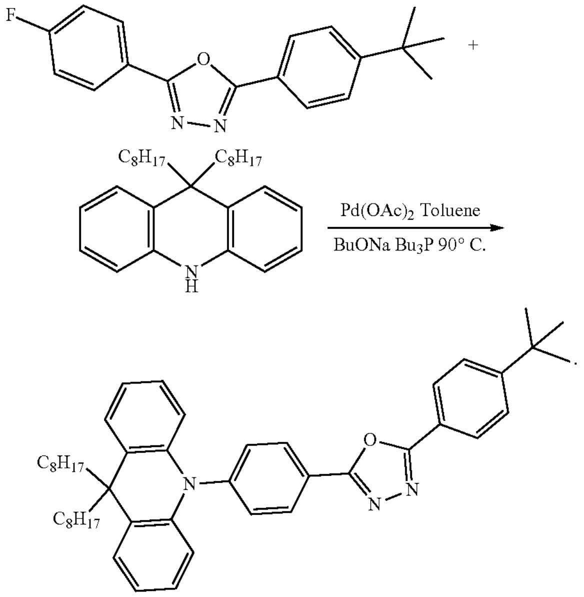

(7) The Preparation of 2-(4-(tert-butyl)phenyl)-5-(4-(2,7-dibromo-9,9-dioctyl-9,10-dihydroacridine-10-yl)phenyl)-1,3,4-oxadiazole (M3)

The following steps are performed: dissolving 2-(4-(tert-butyl)phenyl)-5-(4-(9,9-dioctyl-9,10-dihydroacridine-10-yl)phenyl)-1,3,4-oxadiazole (3.41 g, 5.0 mmol) into 10 mL tetrahydrofuran, adding N-bromosuccinimide (NBS, 2.23 g, 12.5 mmol) in dark conditions, reacting at 25° C. for 8 h, quenching the reaction with water after stopping the reaction, extracting with dichloromethane and drying with anhydrous magnesium sulfate, and recrystallizing with methanol/tetrahydrofuran, to obtain a white solid, which has a yield of 83%. The results for $^1$HNMR, $^{13}$CNMR, MS and element analysis show that the obtained compound is the target product. The chemical reaction equation for the preparation process is shown as below:

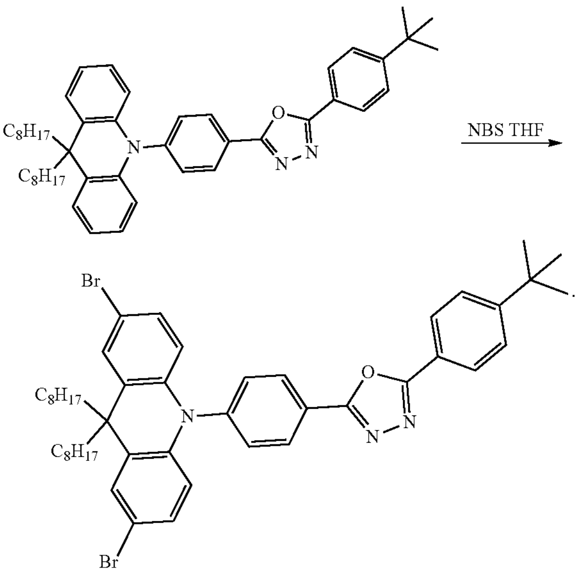

(8) The Preparation of 2-(4-(tert-butyl)phenyl)-5-(4-(9,9-dioctyl-2,7-di(4,4,5,5-tetramethyl-1,3,2-dioxaborolan-2-yl)acridine-10-yl)phenyl)-1,3,4-oxadiazole (M2)

The following steps are performed: under argon atmosphere, dissolving 2-(4-(tert-butyl)phenyl)-5-(4-(2,7-dibromo-9,9-dioctyl-9,10-dihydroacridine-10-yl)phenyl)-1,3,4-oxadiazole (4.19 g, 5.0 mmol), bis(pinacolato)diboron (3.18 g, 12.5 mmol), potassium acetate (2.45 g, 25 mmol) and [1,1'-bis(diphenylphosphino)ferrocene]palladium (II) dichloride ($Pd(dppf)Cl_2$) (183 mg, 0.25 mmol) into 100 ml 1,4-dioxane solution, reacting at 90° C. for 24 h, quenching the reaction with water after stopping the reaction, extracting with dichloromethane and drying with anhydrous magnesium sulfate, concentrating the solution to obtain an earthy yellow liquid, and purifying by silica gel column chromatography with a mixed solvent of petroleum ether and dichloromethane (with a volume ratio of 1:2) used as an eluent to obtain a white solid, which has a yield of 82%. The results for $^1$HNMR, $^{13}$CNMR, MS and element analysis show that the obtained compound is the target product. The chemical reaction equation for the preparation process is shown as below:

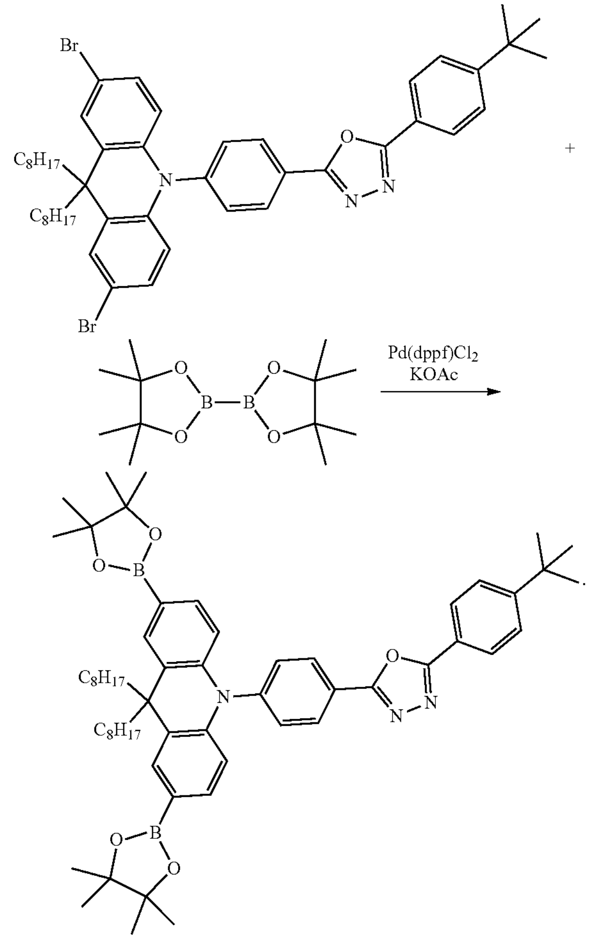

(9) The Preparation of a Polymer PPO-PI5

The following steps are performed: under argon atmosphere, adding the compound M2 (467.0 mg, 0.50 mmol), the compound M3 (376.8 mg, 0.45 mmol) and the compound M1 (38.1 mg, 0.05 mmol) into a 50 mL two-necked flask, and adding 8 mL toluene for complete dissolution, adding palladium acetate (2.80 mg, 12.45 mol) and tricyclohexyl phosphine (6.98 mg, 24.90 mol), then adding 2 mL tetraethyl ammonium hydroxide aqueous solution (with a mass fraction of 20%), raising the temperature to 80° C., and reacting for 24 h; then adding 30 mg phenylboronic acid for the end capping, and adding 0.30 mL bromobenzene for the end capping after 12 h; continuing to react for 12 h, stopping the reaction, when the temperature dropping to room temperature, dropwise adding the product in 300 mL methanol for precipitating, filtrating, and dissolving the crude product in 20 mL toluene, performing column chromatography with 200 to 300 mesh silica gel as stationary phase and toluene as eluent, concentrating the solvent, precipitating out in methanol once again, stirring, filtrating, and drying in vacuum to obtain a polymer solid; finally extracting in sequence with methanol, acetone and tetrahydrofuran for 24 h respectively to remove small molecules; and dropwise adding the concentrated tetrahydrofuran solution into methanol for precipitating, and drying in vacuum to obtain a fibroid solid conjugated polymer PPO-PI5. The results for $^{1}$HNMR, GPC and element analysis show that the obtained compound is the target product. The chemical reaction equation for the preparation process is shown as below:

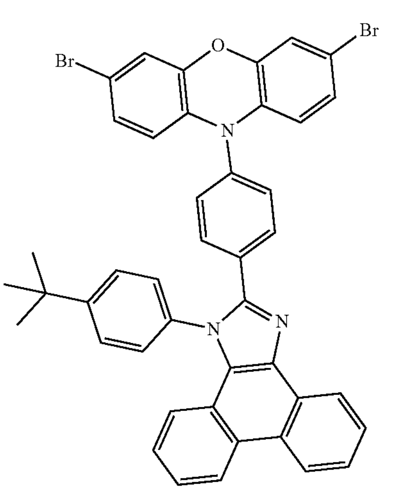

0.05
M1

+

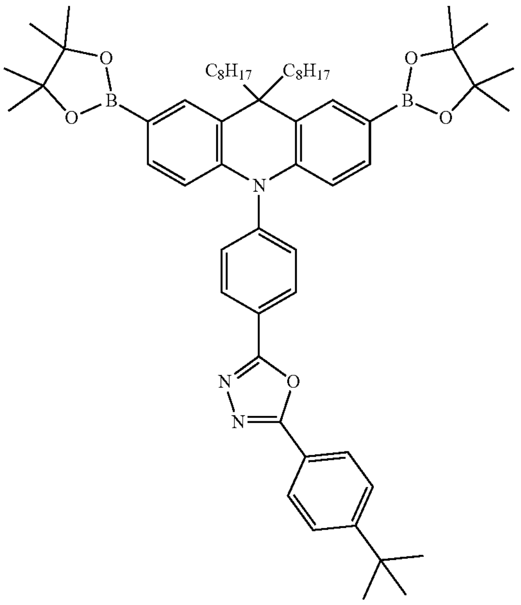

0.5 mmol
M2

+

-continued

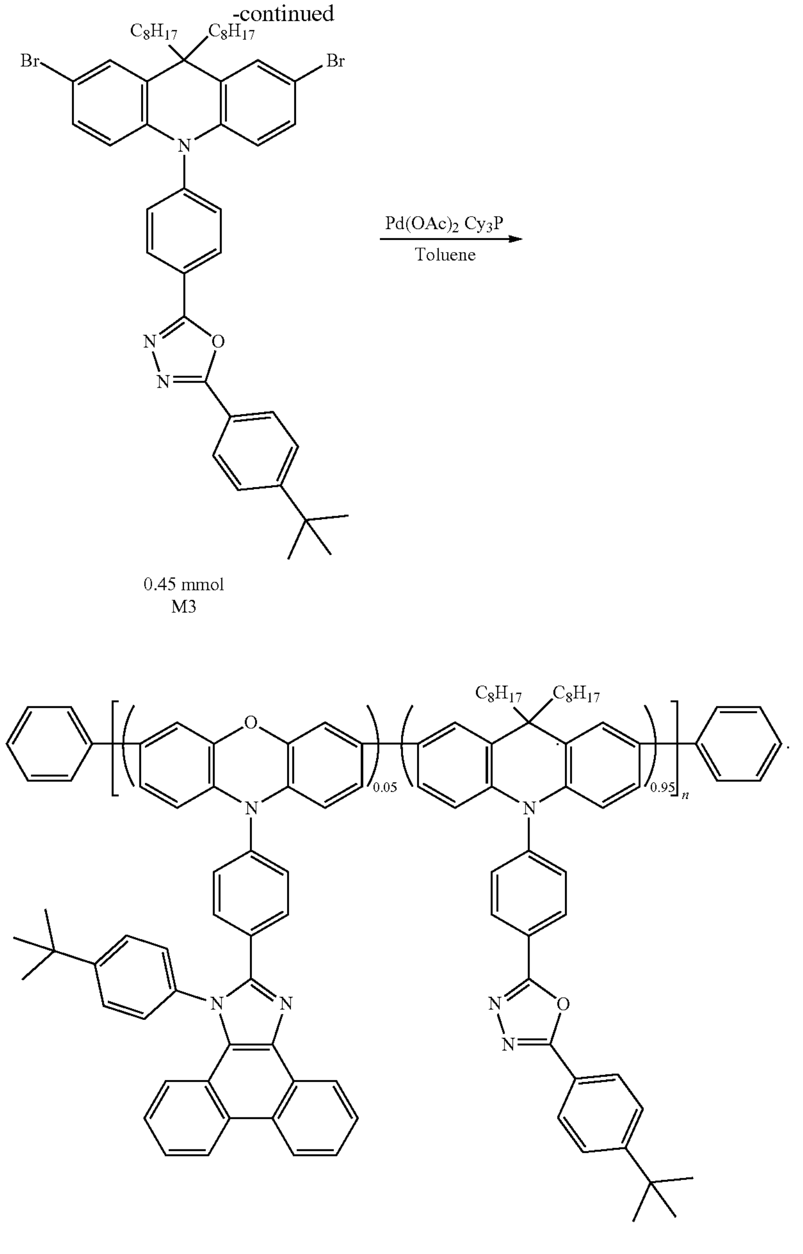

The obtained polymer is detected by means of GPC test. The number average molecular weight Mn is 84000, the weight-average molecular weight Mw is 185000, and the molecular weight distribution index PDI is 2.2. The fluorescent quantum yield of the polymer PPO-PI5 in thin film state respectively is 55%.

(10) the Preparation of a Polymer PPO-PI7

The following steps are performed: under argon atmosphere, adding the compound M2 (467.0 mg, 0.50 mmol), the compound M3 (360.0 mg, 0.43 mmol) and the compound M1 (53.4 mg, 0.07 mmol) into 50 mL two-necked flask, adding 8 mL toluene for complete dissolution, adding palladium acetate (2.80 mg, 12.45 mol) and tricyclohexyl phosphine (6.98 mg, 24.90 mol), then adding 2 mL tetraethyl ammonium hydroxide aqueous solution (with a mass fraction of 20%), raising the temperature to 80° C. and reacting for 24 h; then adding 30 mg phenylboronic acid for the end capping, and adding 0.30 mL bromobenzene for the end capping after 12 h; continuing to react for 12 h, stopping the reaction, when the temperature dropping to room temperature, dropwise adding the product in 300 mL methanol for precipitating, filtrating, and dissolving the crude product in 20 mL toluene, performing column chromatography with 200 to 300 mesh silica gel as stationary phase and toluene as eluent, concentrating the solvent, precipitating out in methanol once again, stirring, filtrating, and drying in vacuum to obtain a polymer solid; finally extracting in sequence with methanol, acetone and tetrahydrofuran for 24 h respectively to remove small molecules; and dropwise adding the concentrated tetrahydrofuran solution into methanol for precipitating, and drying in vacuum to obtain a fibroid solid conjugated polymer PPO-PI7. The results for $^1$HNMR, GPC and element analysis show that the obtained compound is the target product. The chemical reaction equation for the preparation process is shown as below:

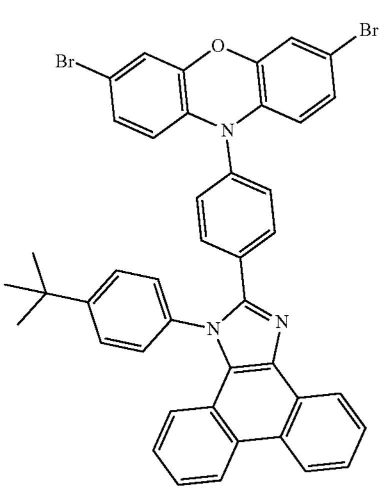
M1
+
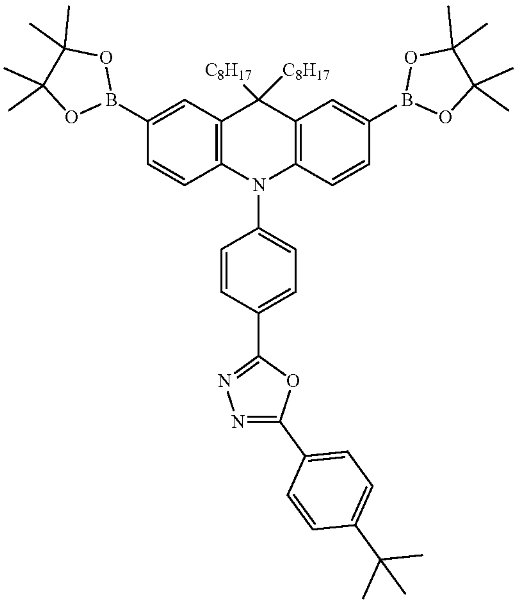
M2
+
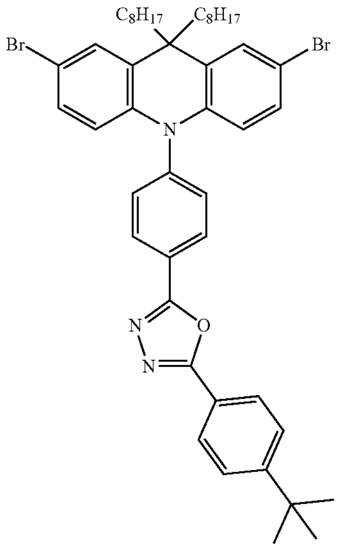
M3
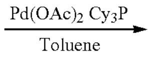

-continued

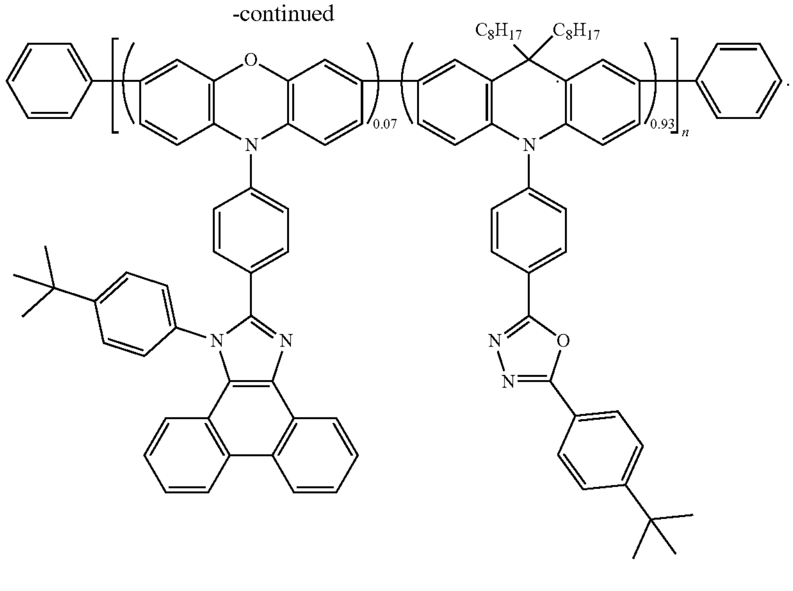

The obtained polymer is detected by means of GPC test. As a result, the number average molecular weight Mn is 77000, the weight-average molecular weight Mw is 177000, and the molecular weight distribution index PDI is 2.3. The fluorescent quantum yield of the polymer PPO-PI7 in thin film state is respectively 59%.

(11) the Preparation of a Polymer PPO-PI10

The following steps are performed: under argon atmosphere, adding the compound M2 (467.0 mg, 0.50 mmol), the compound M3 (334.9 mg, 0.40 mmol) and the compound M1 (76.3 mg, 0.10 mmol) into 50 mL two-necked flask, adding 8 mL toluene for complete dissolution, adding palladium acetate (2.80 mg, 12.45 mol) and tricyclohexyl phosphine (6.98 mg, 24.90 mol), then adding 2 mL tetraethyl ammonium hydroxide aqueous solution (with a mass fraction of 20%), raising the temperature to 80° C. and reacting for 24 h; then adding 30 mg phenylboronic acid for the end capping, and adding 0.30 mL bromobenzene for the end capping after 12 h; continuing to react for 12 h, stopping the reaction, when the temperature dropping to room temperature, dropwise adding the product in 300 mL methanol for precipitating, filtrating, and dissolving the crude product in 20 mL toluene, performing column chromatography with 200 to 300 mesh silica gel as stationary phase and toluene as eluent, concentrating the solvent, precipitating out in methanol once again, stirring, filtrating, and drying in vacuum to obtain a polymer solid; finally extracting in sequence with methanol, acetone and tetrahydrofuran for 24 h respectively to remove small molecules; dropwise adding the concentrated tetrahydrofuran solution into methanol for precipitating, and drying in vacuum to obtain a fibroid solid conjugated polymer PPO-PI10. The results for $^1$HNMR, GPC and element analysis show that the obtained compound is the target product. The chemical reaction equation for the preparation process is shown as below:

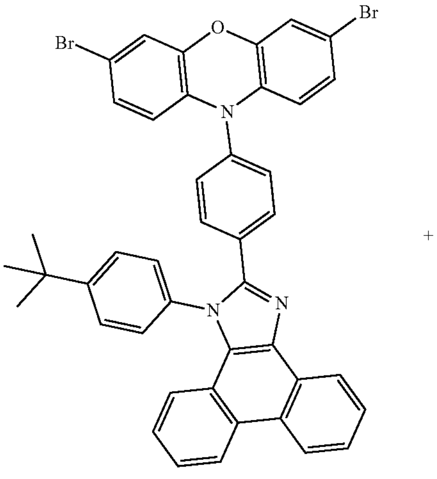

M1

+

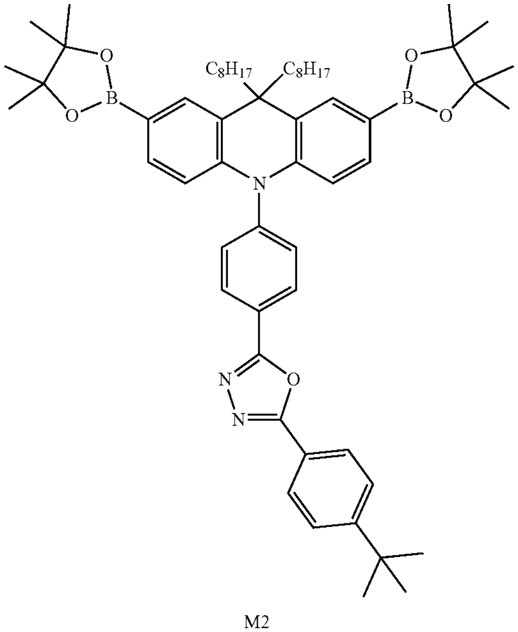

M2

+

-continued

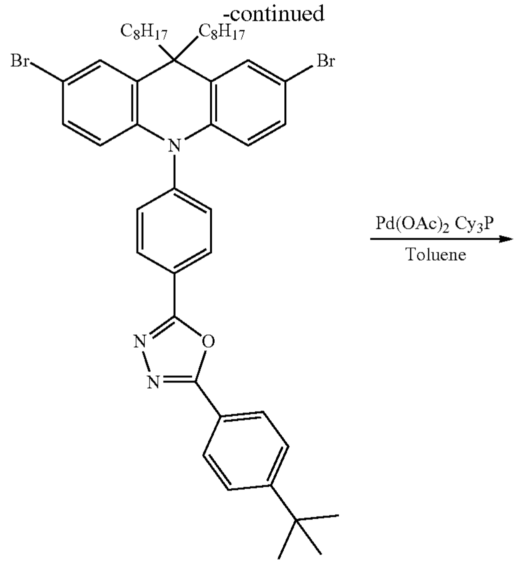

M3

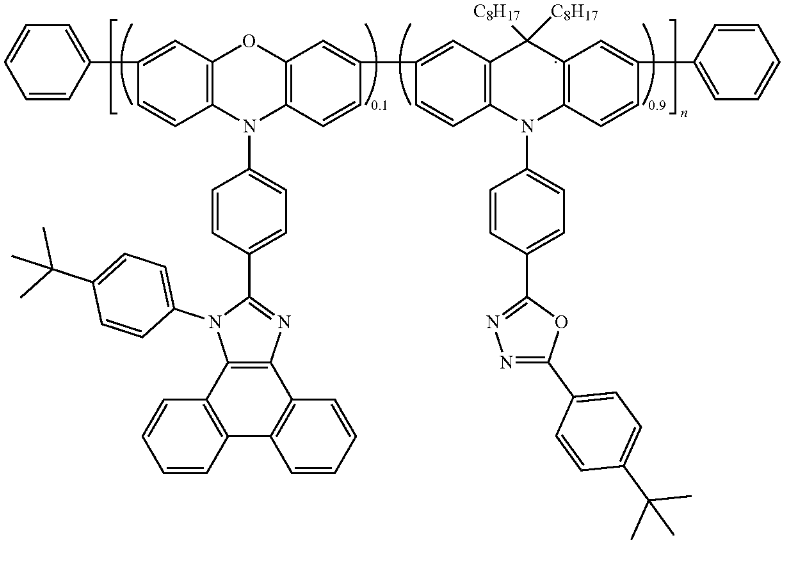

The obtained polymer is detected by means of GPC test. As a result, the number average molecular weight Mn is 58000, the weight-average molecular weight Mw is 133000, and the molecular weight distribution index PDI is 2.3. The fluorescent quantum yield of the polymer PPO-PI10 in thin film state is respectively 62%.

(12) the Preparation of a Polymer PPO-PI12

The following steps are performed: under argon atmosphere, adding the compound M2 (467.0 mg, 0.50 mmol), the compound M3 (318.2 mg, 0.38 mmol) and the compound M1 (91.6 mg, 0.12 mmol) into 50 mL two-necked flask, adding 8 mL toluene for complete dissolution, adding palladium acetate (2.80 mg, 12.45 mol) and tricyclohexyl phosphine (6.98 mg, 24.90 mol), then adding 2 mL tetraethyl ammonium hydroxide aqueous solution (with a mass fraction of 20%), raising the temperature to 80° C. and reacting for 24 h; then adding 30 mg phenylboronic acid for the end capping, and adding 0.30 mL bromobenzene for the end capping after 12 h; continuing to react for 12 h, stopping the reaction, when the temperature dropping to room temperature, dropwise adding the product in 300 mL methanol for precipitating, filtrating, and dissolving the crude product in 20 mL toluene, performing column chromatography with 200 to 300 mesh silica gel as stationary phase and toluene as eluent, concentrating the solvent, precipitating out in methanol once again, stirring, filtrating, and drying in vacuum to obtain a polymer solid; finally extracting in sequence with methanol, acetone and tetrahydrofuran for 24 h respectively to remove small molecules; dropwise adding the concentrated tetrahydrofuran solution into methanol for precipitating, and drying in vacuum to obtain a fibroid solid conjugated polymer PPO-PI12. The results for $^{1}$HNMR, GPC and element analysis show that the obtained compound is the target product. The chemical reaction equation for the preparation process is shown as below:

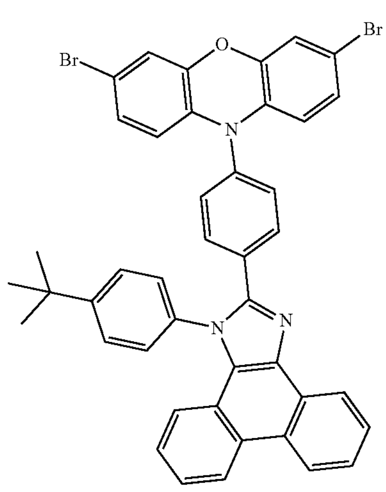
M1
+
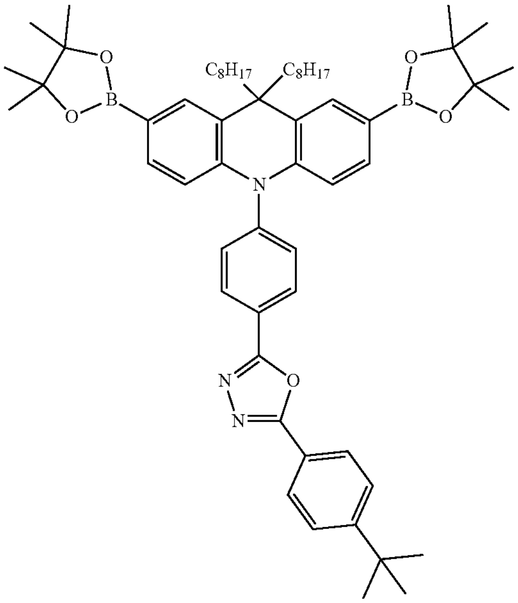
M2
+
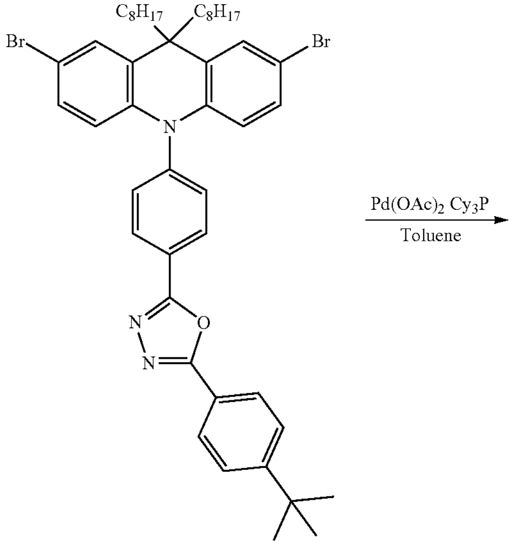
M3

-continued

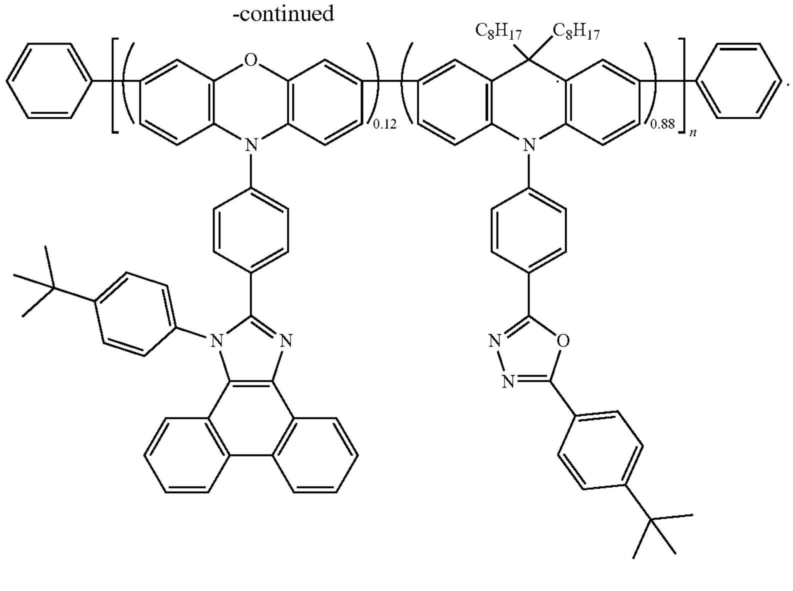

The obtained polymer is detected by means of GPC test. As a result, the number average molecular weight Mn is 62000, the weight-average molecular weight Mw is 149000, and the molecular weight distribution index PDI is 2.4. The fluorescent quantum yield of the polymer PPO-PI12 in thin film state is respectively 65%.

(13) the Preparation of a Polymer PPO-PI15

The following steps are performed: under argon atmosphere, adding the compound M2 (467.0 mg, 0.50 mmol), the compound M3 (293.1 mg, 0.35 mmol) and the compound M1 (114.5 mg, 0.15 mmol) into 50 mL two-necked flask, adding 8 mL toluene for complete dissolution, adding palladium acetate (2.80 mg, 12.45 mol) and tricyclohexyl phosphine (6.98 mg, 24.90 mol), then adding 2 mL tetraethyl ammonium hydroxide aqueous solution (with a mass fraction of 20%), raising the temperature to 80° C. and reacting for 24 h; then adding 30 mg phenylboronic acid for the end capping, and adding 0.30 mL bromobenzene for the end capping after 12 h; continuing to react for 12 h, stopping the reaction, when the temperature dropping to room temperature, dropwise adding the product in 300 mL methanol for precipitating, filtrating, and dissolving the crude product in 20 mL toluene, performing column chromatography with 200 to 300 mesh silica gel as stationary phase and toluene as eluent, concentrating the solvent, precipitating out in methanol once again, stirring, filtrating, and drying in vacuum to obtain a polymer solid; finally extracting in sequence with methanol, acetone and tetrahydrofuran for 24 h respectively to remove small molecules; dropwise adding the concentrated tetrahydrofuran solution into methanol for precipitating, and drying in vacuum to obtain a fibroid solid conjugated polymer PPO-PI15. The results for $^1$HNMR, GPC and element analysis show that the obtained compound is the target product. The chemical reaction equation for the preparation process is shown as below:

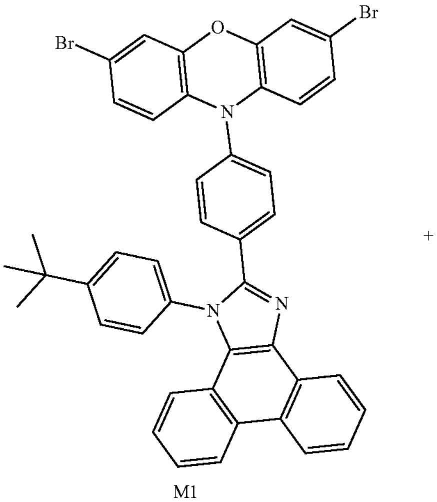

M1

+

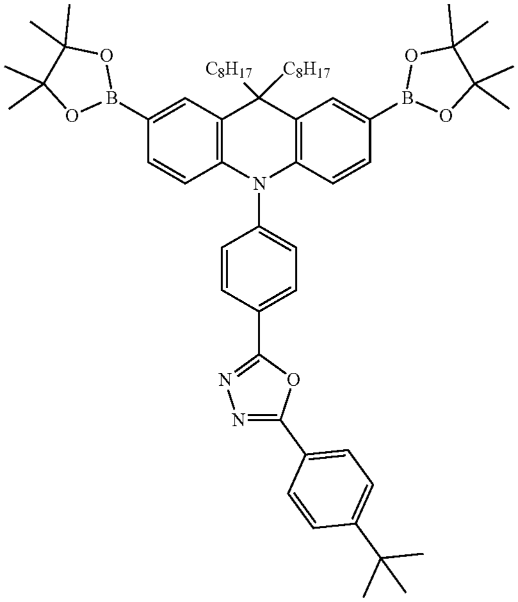

M2

+

-continued

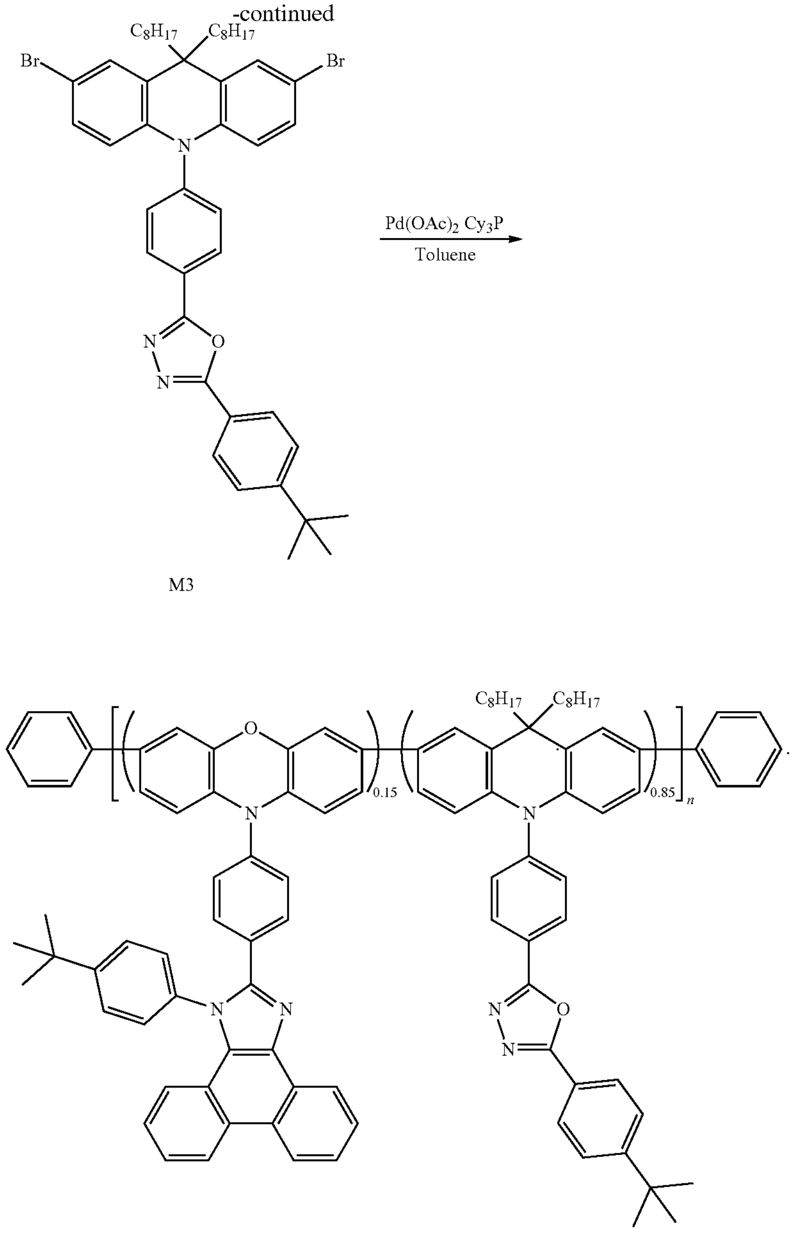

M3

The obtained polymer is detected by means of GPC test. As a result, the number average molecular weight Mn is 58000, the weight-average molecular weight Mw is 133000, and the molecular weight distribution index PDI is 2.3. The fluorescent quantum yield of the polymer PPO-PI15 in thin film state is respectively 70%.

(14) the Preparation of a Polymer PPO-PI20

The following steps are performed: under argon atmosphere, adding the compound M2 (467.0 mg, 0.50 mmol), the compound M3 (251.2 mg, 0.30 mmol) and the compound M1 (152.6 mg, 0.20 mmol) into 50 mL two-necked flask, adding 8 mL toluene for complete dissolution, adding palladium acetate (2.80 mg, 12.45 mol) and tricyclohexyl phosphine (6.98 mg, 24.90 mol), then adding 2 mL tetraethyl ammonium hydroxide aqueous solution (with a mass fraction of 20%), raising the temperature to 80° C. and reacting for 24 h; then adding 30 mg phenylboronic acid for the end capping, and adding 0.30 mL bromobenzene for the end capping after 12 h; continuing to react for 12 h, stopping the reaction, when the temperature dropping to room temperature, dropwise adding the product in 300 mL methanol for precipitating, filtrating, and dissolving the crude product in 20 mL toluene, performing column chromatography with 200 to 300 mesh silica gel as stationary phase and toluene as eluent, concentrating the solvent, precipitating out in methanol once again, stirring, filtrating, drying in vacuum to obtain a polymer solid; finally extracting in sequence with methanol, acetone and tetrahydrofuran for 24 h respectively to remove small molecules; dropwise adding the concentrated tetrahydrofuran solution into methanol for precipitating, and drying in vacuum to obtain a fibroid solid conjugated polymer PPO-PI20. The results for $^{1}$HNMR, GPC and element analysis show that the obtained compound is the target product. The chemical reaction equation for the preparation process is shown as below:

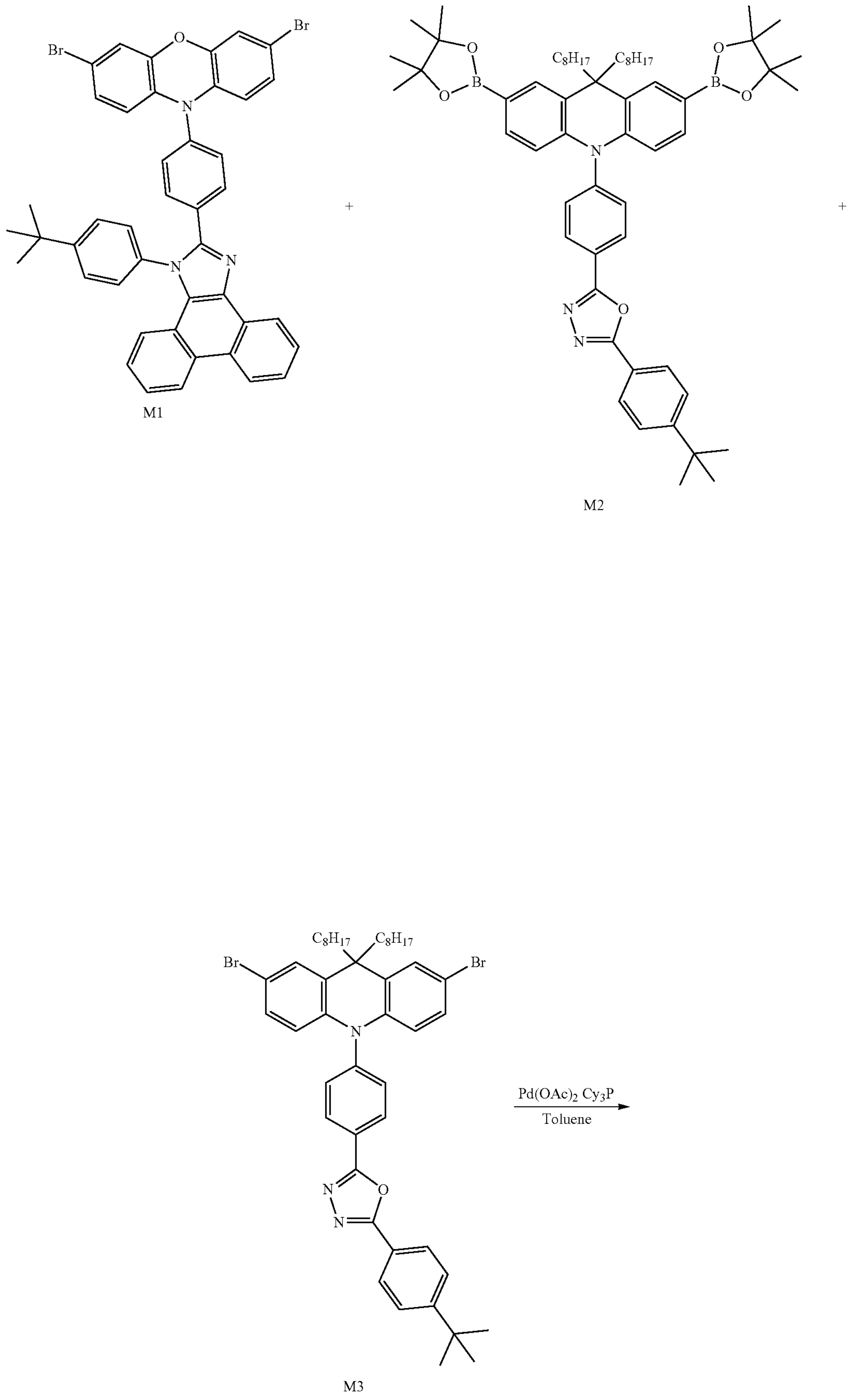
M1 M2 M3

-continued

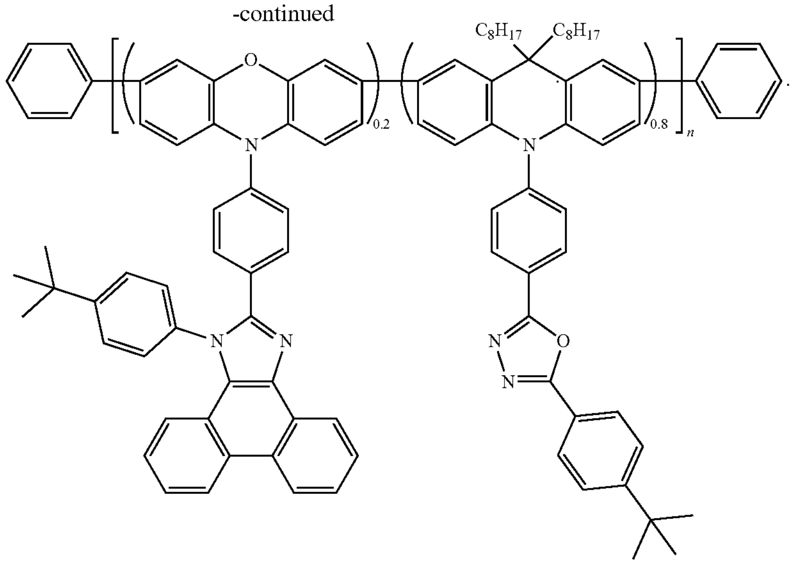

The obtained polymer is detected by means of GPC test. As a result, the number average molecular weight Mn is 58000, the weight-average molecular weight Mw is 133000, and the molecular weight distribution index PDI is 2.3. The fluorescent quantum yield of the polymer PPO-PI20 in thin film state is respectively 76%.

(15) the Preparation of a Comparative Polymer PPO-PI50

The following steps are performed: under argon atmosphere, adding the compound M2 (467.0 mg, 0.50 mmol) and the compound M1 (381.5 mg, 0.50 mmol) into 50 mL two-necked flask, adding 8 mL toluene for complete dissolution, adding palladium acetate (2.80 mg, 12.45 mol) and tricyclohexyl phosphine (6.98 mg, 24.90 mol), then adding 2 mL tetraethyl ammonium hydroxide aqueous solution (with a mass fraction of 20%), raising the temperature to 80° C. and reacting for 24 h; then adding 30 mg phenylboronic acid for the end capping, and adding 0.30 mL bromobenzene for the end capping after 12 h; continuing to react for 12 h, stopping the reaction, when the temperature dropping to room temperature, dropwise adding the product in 300 mL methanol for precipitating, filtrating, and dissolving the crude product in 20 mL toluene, performing column chromatography with 200 to 300 mesh silica gel as stationary phase and toluene as eluent, concentrating the solvent, precipitating out in methanol once again, stirring, filtrating, and drying in vacuum to obtain a polymer solid; finally extracting in sequence with methanol, acetone and tetrahydrofuran for 24 h respectively to remove small molecules; dropwise adding the concentrated tetrahydrofuran solution into methanol for precipitating, and drying in vacuum to obtain a fibroid solid conjugated polymer PPO-PI50. The results for $^{1}$HNMR, GPC and element analysis show that the obtained compound is the target product. The chemical reaction equation for the preparation process is shown as below:

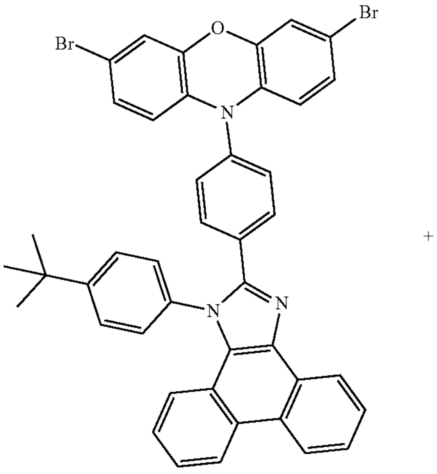

M1

+

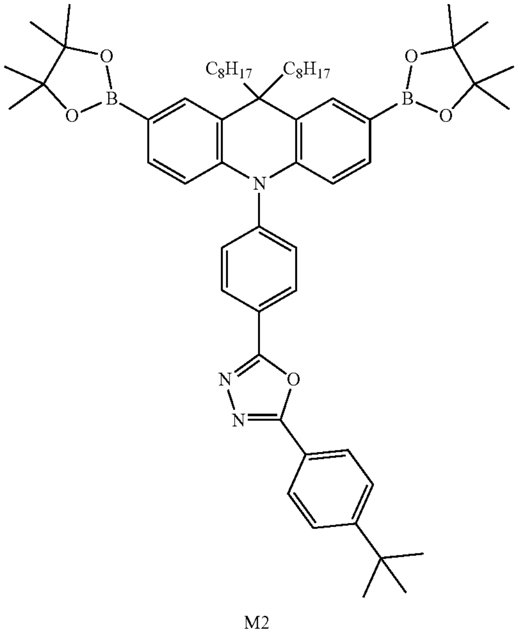

M2

+

-continued

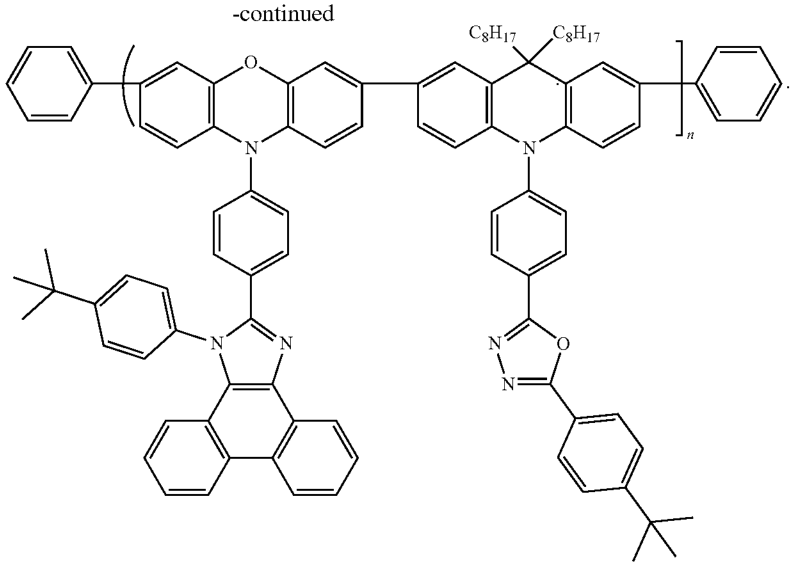

The obtained polymer is detected by means of GPC test. As a result, the number average molecular weight Mn is 32000, the weight-average molecular weight Mw is 76800, and the molecular weight distribution index PDI is 2.4. The fluorescent quantum yield of the polymer PPO-PI50 in thin film state is respectively 42%.

The thermogravimetric curve of the polymer PPO-PI5 is as shown in FIG. 1. When the temperature is 435° C. and the weight of the polymer PPO-PI5 is reduced by 5%, its decomposition temperature is up to 435° C. It shows that the polymer PPO-PI5 has excellent thermal stability, and it is beneficial to apply this polymer in the preparation of electroluminescent device. The more excellent thermal stability is attributed to a big planar and rigid structure of the phenanthroimidazole unit. Additionally, due to the modification by oil soluble group of n-octyl and tert-butyl, the polymer PPO-PI5 has more excellent solubility in commonly used organic solvents such as dichloromethane, chloroform, tetrahydrofuran and chlorobenzene, and its solubilities are 50 mg/mL, 55 mg/mL, 70 mg/mL and 80 mg/mL respectively. Therefore, the electroluminescent device can be prepared through a solution spin coating method using the polymer PPO-PI5 as the material for a light-emitting layer.

Additionally, the fluorescent quantum yields of the polymer PPO-PI5 are respectively 76%, 84%, 85% and 88% in solvents of dichloromethane, chloroform, tetrahydrofuran and toluene. The higher fluorescent quantum yield indicates that the polymer PPO-PI5 has the stronger fluorescence, which is suitable for the light-emitting layer in an electroluminescent device.

Figure 2:
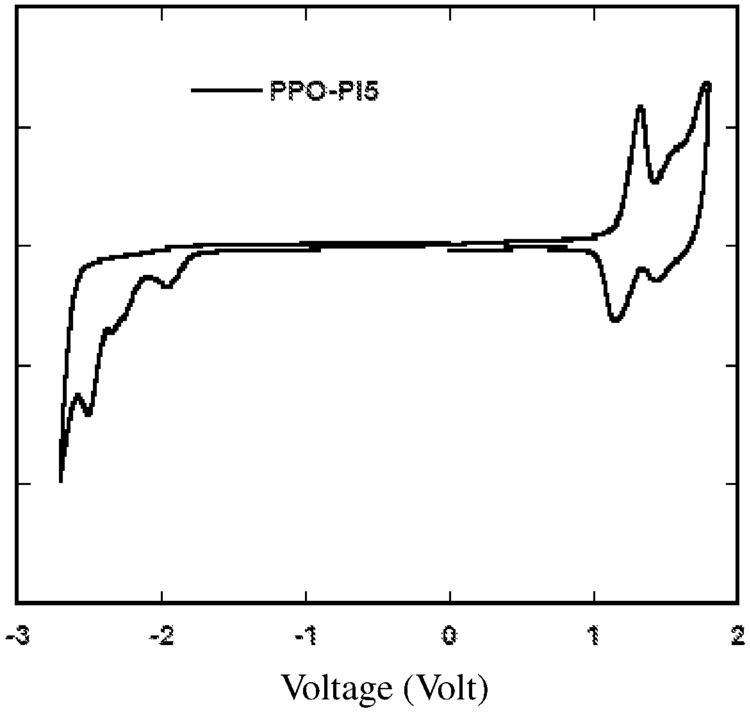
FIG. 2 shows a cyclic voltammetry curve of a polymer PPO-PI5.

The electrochemical performances of the polymer PPO-PI5 are measured by Cyclic Voltammetry on CHI 800A Electrochemical Workstation. Platinum wire electrode, graphite electrode and calomel electrode are respectively an auxiliary electrode, working electrode and reference electrode. The electrolyte is 0.1 mol/L anhydrous acetonitrile of tetrabutylammonium hexafluorophosphate, and the standard sample is ferrocene. A film is formed on the working electrode surface by utilizing a toluene solution of the polymer, and a test is performed by measuring the Cyclic Voltammetry characters thereof under an argon gas environment, as shown in FIG. 2. The oxidation potential and the reduction potential of the polymer PPO-PI5 are respectively 1.04 V and −1.80 V. The redox potential of ferrocene is 0.38 eV. In a vacuum state, the redox potential of ferrocene is −4.8 eV. According to the empirical formula $E_{HOMO}=-e(E_{ox}+4.80-E_{fer})$ (eV) and $E_{LUMO}=-e(E_{red}+4.80-E_{fer})$ (eV), the energy level of highest occupied molecular orbital (HOMO) of the polymer PPO-PI5 is −5.46 eV, and the energy level of lowest unoccupied molecular orbital (LUMO) is −2.62 eV.

Figure 3:
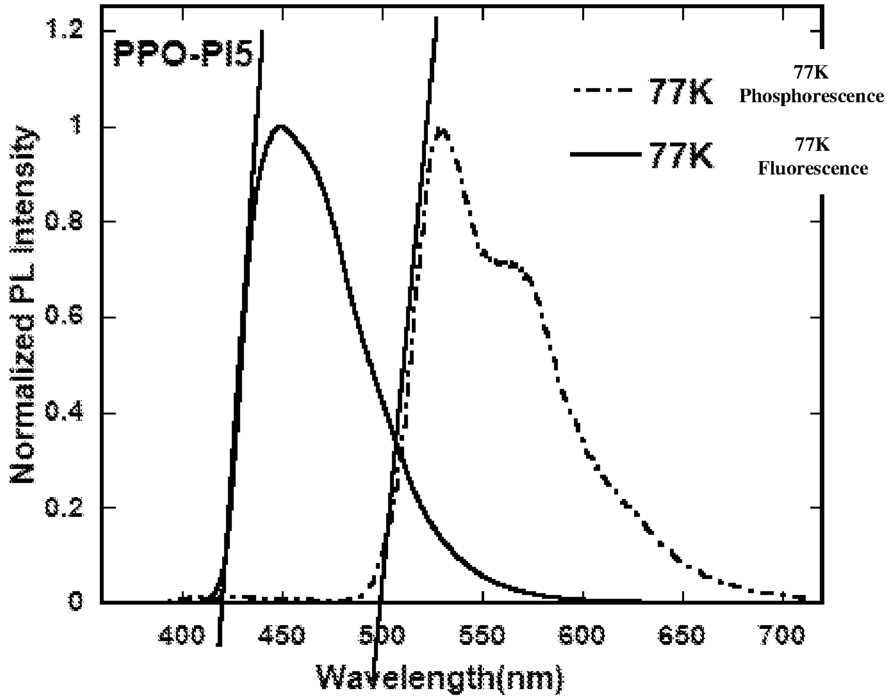
FIG. 3 shows a low-temperature fluorescence spectra and a low-temperature phosphorescence spectra of a polymer PPO-PI5 in a toluene solvent.

A fluorescence spectrometer of Fluorolog-3 JobinYvon type is used to measure the photoluminescence spectrum of the polymer PPO-PI5. The toluene solution of the polymer PPO-PI5 is frozen to 77 K with liquid nitrogen, and is measured for the fluorescence spectrum and phosphorescence spectrum thereof at the temperature condition of 77K. They are shown in FIG. 3. S1 energy level is obtained from the fluorescence spectrum with the toluene solution of the polymer at 77K, and is 2.91 eV; while T1 energy level is obtained from the phosphorescence spectrum with the toluene solution of the polymer at 77K, and is 2.48 eV. The energy level difference between the singlet state and the triplet state is 0.43 eV ($\Delta E_{ST}\leq 0.5$ eV). Data for energy levels of the singlet and triplet states of the polymers PPO-PIs in toluene solution at a temperature of 77K is shown in Table 1. As can be seen from Table 1, this series of polymers all have smaller energy level difference between the singlet state and the triplet state ($\Delta E_{ST}\leq 0.5$ eV), and can realize the reverse intersystem crossing of triplet-state excitons.

TABLE 1

Data for energy levels of the singlet states and triplet states of the polymers PPO-PIs in toluene solution at a temperature of 77K

| Item | energy level of the singlet state (eV) | energy level of the triplet state (eV) | lifetime |
|---|---|---|---|
| PPO-PI5 | 2.91 | 2.48 | 3.68 ms |
| PPO-PI7 | 2.91 | 2.48 | 3.61 ms |
| PPO-PI10 | 2.91 | 2.48 | 3.03 ms |
| PPO-PI12 | 2.91 | 2.49 | 2.46 ms |
| PPO-PI15 | 2.92 | 2.48 | 2.19 ms |
| PPO-PI20 | 2.92 | 2.49 | 1.77 ms |
| PPO-PI50 | 2.92 | 2.50 | 9.14 ns |

Figure 4:
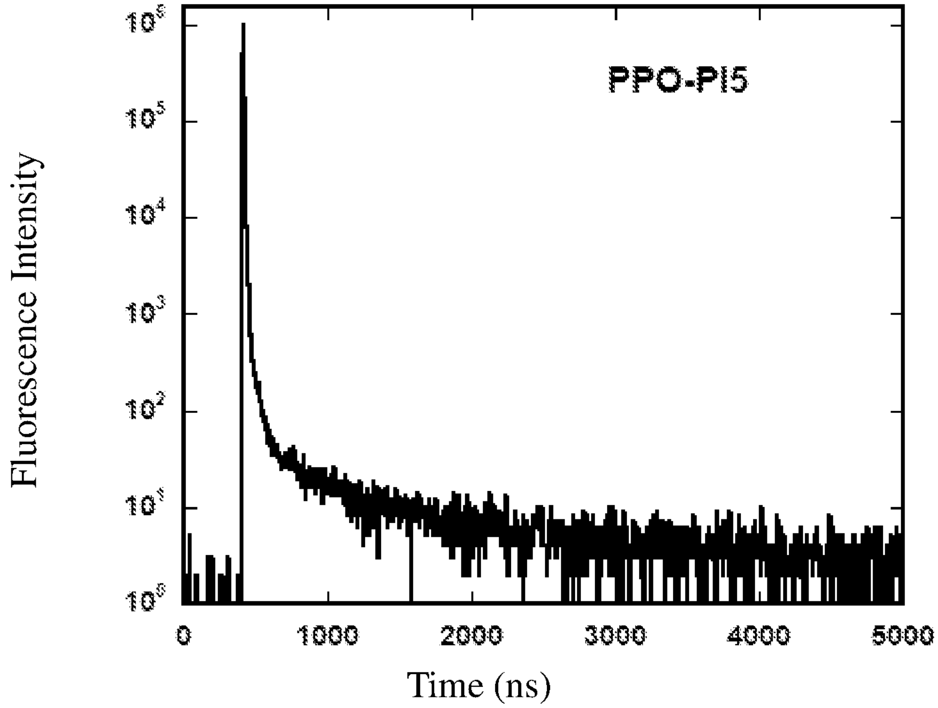
FIG. 4 shows a fluorescence lifetime spectra of a toluene solution of a polymer PPO-PI5 in the case of deoxygenation.

This conclusion is further demonstrated by adopting a C11367 type of fluorescence lifetime spectrometer from Hamamatsu Company to gather data for fluorescence lifetime of the polymer PPO-PI5 in toluene solution in the case of deoxygenation, as shown in FIG. 4. After the deoxygenation treatment to the toluene solution of the polymer PPO-PI5, the fluorescence lifetime is as long as 3.68 ms. This longer fluorescence lifetime demonstrates the polymer PPO-PI5 has indeed reverse intersystem crossing of triplet state excitons to singlet state energy level in the excited state, in turn prolonging the fluorescence lifetime of the polymer PPO-PI5. Except for the comparative the polymer PPO-PI50 (with a lifetime of 9.14 ns), the fluorescence lifetimes of other polymers of this series are all in the millisecond level.

Figure 5:
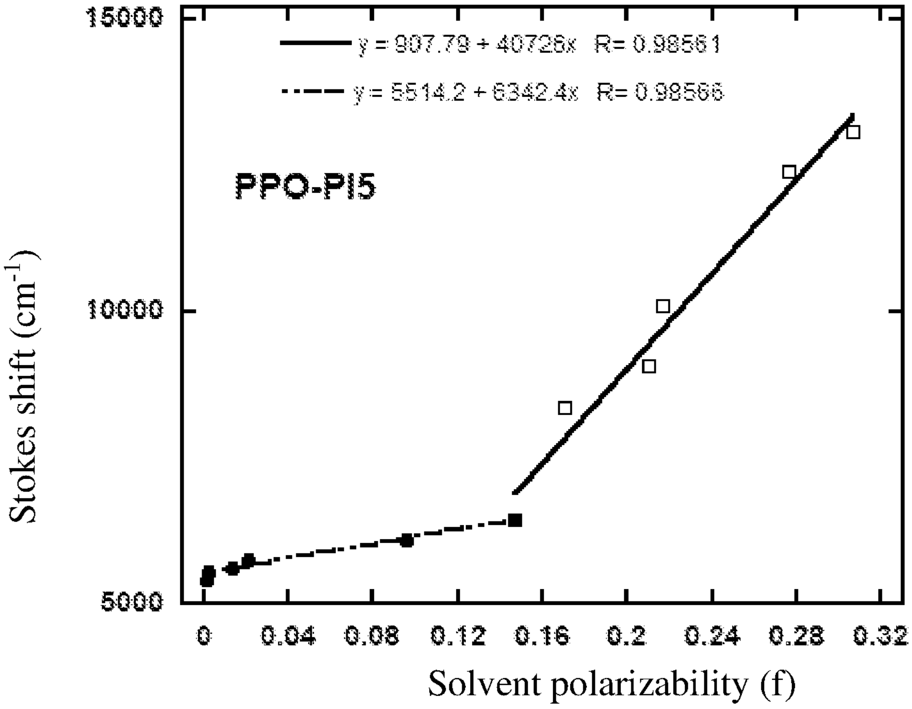
FIG. 5 shows the linear correlation of orientation polarization of different solvent media with the Stokes shift for a polymer PPO-PI5.

The relation curve between Stokes shift and solvent polarizability of the polymer PPO-PI5 in solvents of different polarities is shown in FIG. 5. When the polarizability f≤0.15, a slope of the curve is smaller, indicating that the polymer PPO-PI5 in solvents with low polarity (polarizability f≤0.15) exhibits typical localized excited state luminescence characteristics. While in a solvent with medium polarity (f=0.147), the charge transfer (CT) component in the molecular excited state begins to stand out. When the polarizability f≥0.2, a slope of the curve is larger, indicating that the polymer PPO-PI5 in solvents with high polarity (f≥0.2) exhibits typical charge transfer luminescence properties. It shows that the molecular excited state of the polymer PPO-PI5 coexists in the localized and charge transfer states, which confirms the existence of the hybridized local and charge-transfer state of the polymer PPO-PI5, exhibiting localized luminescence characteristic at low polarity, and exhibiting CT-state luminescence feature at high polarity.

Example 2

The preparation of organic electroluminescent device:

The following steps are performed:

(1) cleaning of an ITO conductive glass, placing the ITO glass substrate on a washing rack, ultrasonic cleaning with an ultrasonic machine with washing solutions in the order of acetone, isopropanol, detergent, deionized water and isopropanol, for a objective of fully removing the possible residual stains such as photoresist etc. on the surface of the ITO glass substrate, and improving the interface contact, then drying in a vacuum oven;

(2) placing the ITO in an oxygen plasma etching instrument, and bombarding with oxygen plasma ($O_2$ Plasma) for 20 minutes to completely eliminate the possible residual organic matters on the surface of the ITO glass substrate;

(3) spin coating a 40 nm thick hole-injection layer PEDOT:PSS (BaytronP4083) on the ITO, then drying in a vacuum oven for 12 h at 80° C.;

(4) in a glove box under nitrogen atmosphere, spin coating a layer of 80 nm thick luminescence polymer thin film on the layer PEDOT:PSS, and heating for annealing at a temperature of 80° C. for 20 min on a heating stage, to remove the residual solvent and improve a morphology of the light-emitting layer film; and (5) under a vacuum degree of less than $3\times10^{-4}$ Pa in a vacuum evaporation chamber, firstly evaporating a 20 nm thick layer of 1,3,5-tris(1-phenyl-1H-benzimidazol-2-yl)benzene on the organic thin film, and evaporating a 1.5 nm thick layer of cesium fluoride (CsF), being conducive to electron injection, then evaporating a 110 nm thick layer of aluminum cathode (Al) on CsF, with the cesium fluoride and the aluminum layers vacuum deposited through a mask plate.

The effective area of the device is 0.1 $cm^2$. The thickness of the organic layer is measured with a quartz crystal monitoring thickness gauge. The prepared device is subjected to polar curing and encapsulation in UV light with epoxy resin and a thin layer of glass. The device has a structure of (ITO/PEDOT:PSS/Emitter (60 nm)/TPBI (20 nm)/CsF (1.5 nm)/Al (110 nm)).

The obtained electroluminescent device is respectively tested for photo and electric properties, and the results for tests are shown in Table 2.

TABLE 2 data for the electroluminescence properties of the electroluminescent polymer.

| item | maximum luminous efficiency (candela per ampere) | maximum brightness (candela per square meter) | color coordinate (x, y) | maximum external quantum efficiency (percentage) | turn-on voltage (volt) |
|---|---|---|---|---|---|
| PPO-PI5 | 11.16 | 11970 | (0.25, 0.19) | 7.20 | 3.6 |
| PPO-PI7 | 12.87 | 13764 | (0.25, 0.20) | 8.28 | 4.0 |
| PPO-PI10 | 13.93 | 12799 | (0.26, 0.19) | 7.70 | 4.0 |
| PPO-PI12 | 12.29 | 13167 | (0.26, 0.21) | 7.92 | 3.8 |
| PPO-PI15 | 15.52 | 13675 | (0.26, 0.23) | 5.01 | 3.8 |
| PPO-PI20 | 17.17 | 15179 | (0.27, 0.24) | 8.56 | 3.6 |
| PPO-PI50 | 6.29 | 9358 | (0.30, 0.25) | 2.25 | 3.8 |

The luminescence properties of the obtained electroluminescent device are characterized. As known from the Table, the prepared devices with the polymers PPO-PIs as the light-emitting layer have the maximum luminous efficiency of 17.17 cd/A, and the external quantum efficiency of 8.56%, higher than a theoretical value of 5%. It is also indicated that the polymers of this system have the advantage of high utilization for excitons. While the maximum luminous efficiency of the comparative polymer PPO-PI50 is merely 6.29 cd/A, and the external quantum efficiency thereof is merely 2.25%. In contrast, the polymer claimed in the present invention has excellent photoelectric properties, and has characteristics of hybridized local and charge-transfer states.

The above-described Examples are preferred embodiments of the present invention, but embodiments of the present invention are not limited to the above-described Examples, any other changes, modifications, substitutions, combinations, and simplifications made without departing from the spirit and the principle of the present invention should all be equivalent replacement modes, and all be contained in the protection scope of the present invention.

The invention claimed is:

1. An electroluminescent polymer based on a phenanthroimidazole unit, characterized in that, it has a chemical structural formula as shown below:

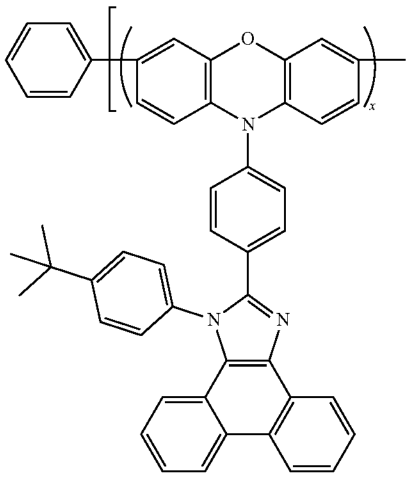

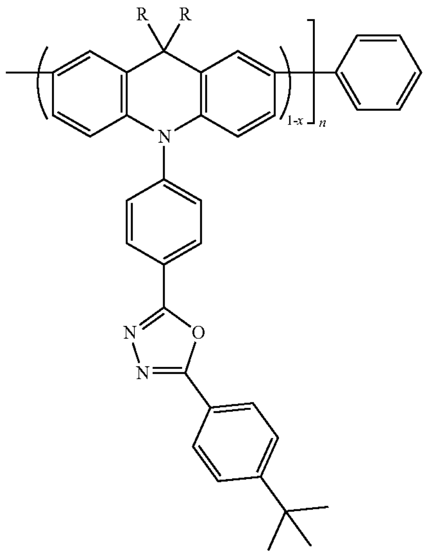

wherein, R is relatively independently one of a linear-chain, branched or cyclic alkyl with 1 to 20 carbon atoms, a linear-chain, branched or cyclic alkenyl with 2 to 20 carbon atoms, and a linear-chain, branched or cyclic alkynyl with 2 to 20 carbon atoms;

x meets $0.001 \leq x < 0.50$; and n is 2 to 300.

2. The electroluminescent polymer based on the phenanthroimidazole unit according to claim 1, characterized in that:

R in the structural formula is octyl; and $0.05 \leq x \leq 0.20$.

3. A preparation method for the electroluminescent polymer based on the phenanthroimidazole unit according to claim 1, characterized in that, it comprises the following steps:

under a protection of inert gas, dissolving polymeric monomers M1, M2 and M3 into a solvent, then adding a catalyst and an organic alkali tetraethylammonium hydroxide, heating to a temperature of 80 to 100° C. for incurring Suzuki polymerization reaction with a reaction time of 24 to 48 h; adding phenylboronic acid, maintaining the temperature and continuing to react for 12 to 24 h; adding bromobenzene, continuing to maintain the temperature and react for 12 to 24 h, and purifying a resulting reaction solution after stopping the reaction, to obtain a target product;

wherein structures of the polymeric monomers M1, M2 and M3 are shown as below:

M1

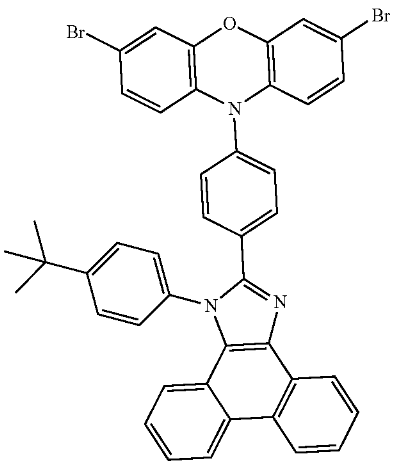

M2

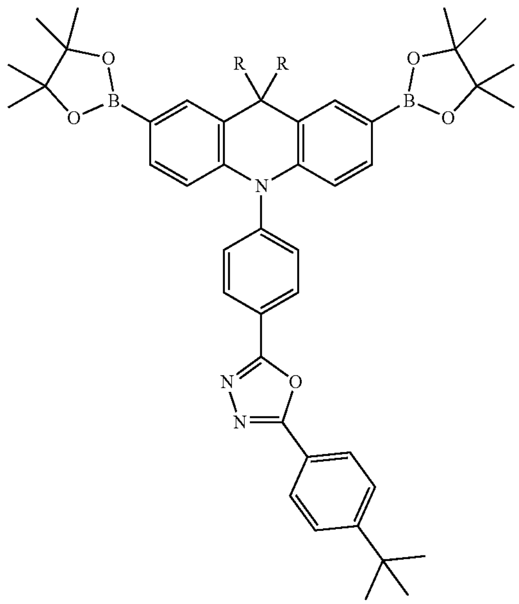

-continued

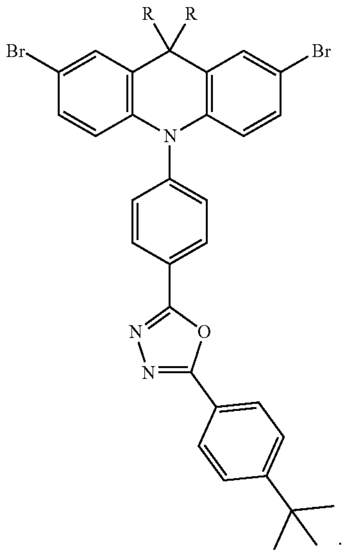

M3

4. The preparation method for the electroluminescent polymer based on the phenanthroimidazole unit according to claim 3, characterized in that:

the solvent is at least one of toluene, tetrahydrofuran, chloroform, and chlorobenzene; a volume ratio of the solvent to the organic alkali tetraethylammonium hydroxide aqueous solution is 15 to 3:1, wherein a mass fraction of the tetraethylammonium hydroxide aqueous solution is 20%; and the catalyst is a system of palladium acetate and tricyclohexyl phosphine; an amount of the catalyst is 5% c to 5% of a total molar amount of the monomers for reaction, a molar ratio of the palladium acetate to the tricyclohexyl phosphine is 1:2; and a ratio of a molar amount of the tetraethylammonium hydroxide to the total molar amount of the polymeric monomers is 1 to 5:1.

5. The preparation method for the electroluminescent polymer based on the phenanthroimidazole unit according to claim 3, characterized in that:

a molar ratio of the used polymeric monomers M1 to M2 to M3 is x:0.5:(0.5−x), wherein a range of x is $0.001 \leq x < 0.50$; and an amount of the phenylboronic acid is 5% to 30% of a total molar amount of the monomers for reaction; and an amount of the bromobenzene is 2 to 20 times of a molar amount of the phenylboronic acid.

6. A method for preparing a light emitting layer of a light-emitting diode comprising the electroluminescent polymer based on the phenanthroimidazole unit according to claim 1, the method comprising: dissolving the electroluminescent polymer based on the phenanthroimidazole unit with an organic solvent, and forming a film through spin coating, inkjet printing or printing.

7. The method according to claim 6, characterized in that:

the organic solvent is at least one of toluene, chlorobenzene, xylene, tetrahydrofuran, and chloroform.

* * * * *